(12) United States Patent
Murayama et al.

(10) Patent No.: US 10,013,650 B2
(45) Date of Patent: Jul. 3, 2018

(54) WIRELESS COMMUNICATION MODULE AND WIRELESS COMMUNICATION DEVICE

(75) Inventors: Hiromi Murayama, Nagaokakyo (JP); Noboru Kato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 724 days.

(21) Appl. No.: 13/598,872

(22) Filed: Aug. 30, 2012

(65) Prior Publication Data
US 2012/0326931 A1 Dec. 27, 2012

Related U.S. Application Data

(63) Continuation of application No. PCT/JP2011/052594, filed on Feb. 8, 2011.

(30) Foreign Application Priority Data

Mar. 3, 2010 (JP) .................. 2010-046525

(51) Int. Cl.
*H01Q 7/00* (2006.01)
*H01Q 1/24* (2006.01)
(Continued)

(52) U.S. Cl.
CPC ..... *G06K 19/07749* (2013.01); *H01Q 1/2225* (2013.01); *H01Q 1/2283* (2013.01);
(Continued)

(58) Field of Classification Search
CPC .......... H01Q 7/00–7/08; H01Q 1/2283; H01Q 1/2208–1/2241; H01L 51/0097; H01L 23/49572; G06K 19/07749–19/07756
See application file for complete search history.

(56) References Cited

U.S. PATENT DOCUMENTS 3,364,564 A    1/1968    Kurtz et al.
4,794,397 A    12/1988    Ohe et al.
(Continued)

FOREIGN PATENT DOCUMENTS

CA    2 279 176 A1    7/1998
CN    1917285 A * 2/2007
(Continued)

OTHER PUBLICATIONS

"Modulus of Elasticity or Young's Modulus—and Tensile Modulus for some common Materias." The Engineering ToolBox. Web. Feb. 10, 2016. <http://www.engineeringtoolbox.com/young-modulus-d_417.html>.*

(Continued)

*Primary Examiner* — Jessica Han
*Assistant Examiner* — Amal Patel
(74) *Attorney, Agent, or Firm* — Keating & Bennett, LLP

(57) ABSTRACT

A wireless communication module and a wireless communication device that are less likely to become detached even when attached to a flexible base substrate and have a reduced height includes a flexible multilayer substrate including a plurality of stacked flexible base materials and a cavity provided therein, a wireless IC chip arranged in the cavity, and a sealant filled in the cavity so as to cover the wireless IC chip. The sealant is a material that is harder than the flexible base materials. The flexible multilayer substrate includes a loop-shaped electrode defined by coil patterns. The loop-shaped electrode is electrically connected to the wireless IC chip.

13 Claims, 14 Drawing Sheets

(51) Int. Cl.
 *G06K 19/077* (2006.01)
 *H01Q 1/22* (2006.01)
(52) U.S. Cl.
 CPC ..... *H01Q 7/00* (2013.01); *H01L 2224/16225* (2013.01); *H01L 2924/181* (2013.01)

(56) References Cited

U.S. PATENT DOCUMENTS

| | | | |
|---|---|---|---|
| 5,232,765 A | 8/1993 | Yano et al. | |
| 5,253,969 A | 10/1993 | Richert | |
| 5,337,063 A | 8/1994 | Takahira | |
| 5,374,937 A | 12/1994 | Tsunekawa et al. | |
| 5,399,060 A | 3/1995 | Richert | |
| 5,491,483 A | 2/1996 | D'Hont | |
| 5,528,222 A | 6/1996 | Moskowitz et al. | |
| 5,757,074 A | 5/1998 | Matloubian et al. | |
| 5,854,480 A | 12/1998 | Noto | |
| 5,903,239 A | 5/1999 | Takahashi et al. | |
| 5,936,150 A | 8/1999 | Kobrin et al. | |
| 5,955,723 A | 9/1999 | Reiner | |
| 5,955,752 A | 9/1999 | Fukaya et al. | |
| 5,995,006 A | 11/1999 | Walsh | |
| 6,104,611 A | 8/2000 | Glover et al. | |
| 6,107,920 A | 8/2000 | Eberhardt et al. | |
| 6,160,526 A * | 12/2000 | Hirai et al. | 343/895 |
| 6,172,608 B1 | 1/2001 | Cole | |
| 6,181,287 B1 | 1/2001 | Beigel | |
| 6,190,942 B1 | 2/2001 | Wilm et al. | |
| 6,243,045 B1 | 6/2001 | Ishibashi | |
| 6,249,258 B1 | 6/2001 | Bloch et al. | |
| 6,259,369 B1 | 7/2001 | Monico | |
| 6,271,803 B1 | 8/2001 | Watanabe et al. | |
| 6,335,686 B1 | 1/2002 | Goff et al. | |
| 6,362,784 B1 | 3/2002 | Kane et al. | |
| 6,367,143 B1 | 4/2002 | Sugimura | |
| 6,378,774 B1 | 4/2002 | Emori et al. | |
| 6,406,990 B1 | 6/2002 | Kawai | |
| 6,448,874 B1 | 9/2002 | Shiino et al. | |
| 6,452,563 B1 | 9/2002 | Porte | |
| 6,462,716 B1 | 10/2002 | Kushihi | |
| 6,542,050 B1 | 4/2003 | Arai et al. | |
| 6,600,459 B2 | 7/2003 | Yokoshima et al. | |
| 6,607,135 B1 * | 8/2003 | Hirai | G06K 19/07718 235/487 |
| 6,634,564 B2 | 10/2003 | Kuramochi | |
| 6,664,645 B2 | 12/2003 | Kawai | |
| 6,763,254 B2 | 7/2004 | Nishikawa | |
| 6,812,707 B2 | 11/2004 | Yonezawa et al. | |
| 6,828,881 B2 | 12/2004 | Mizutani et al. | |
| 6,837,438 B1 | 1/2005 | Takasugi et al. | |
| 6,861,731 B2 | 3/2005 | Buijsman et al. | |
| 6,927,738 B2 | 8/2005 | Senba et al. | |
| 6,956,481 B1 | 10/2005 | Cole | |
| 6,963,729 B2 | 11/2005 | Uozumi | |
| 7,088,249 B2 | 8/2006 | Senba et al. | |
| 7,088,307 B2 | 8/2006 | Imaizumi | |
| 7,112,952 B2 | 9/2006 | Arai et al. | |
| 7,119,693 B1 | 10/2006 | Devilbiss | |
| 7,129,834 B2 | 10/2006 | Naruse et al. | |
| 7,248,221 B2 | 7/2007 | Kai et al. | |
| 7,250,910 B2 | 7/2007 | Yoshikawa et al. | |
| 7,276,929 B2 | 10/2007 | Arai et al. | |
| 7,317,396 B2 | 1/2008 | Ujino | |
| 7,405,664 B2 | 7/2008 | Sakama et al. | |
| 7,633,395 B2 * | 12/2009 | Kanno | 340/572.7 |
| 2001/0011012 A1 | 8/2001 | Hino et al. | |
| 2002/0011967 A1 | 1/2002 | Goff et al. | |
| 2002/0015002 A1 | 2/2002 | Yasukawa et al. | |
| 2002/0044092 A1 | 4/2002 | Kushihi | |
| 2002/0067316 A1 | 6/2002 | Yokoshima et al. | |
| 2002/0093457 A1 | 7/2002 | Hamada et al. | |
| 2002/0186004 A1 | 12/2002 | Prazeres da Costa et al. | |
| 2003/0006901 A1 | 1/2003 | Kim et al. | |
| 2003/0020661 A1 | 1/2003 | Sato | |
| 2003/0045324 A1 | 3/2003 | Nagumo et al. | |
| 2003/0169153 A1 | 9/2003 | Muller | |
| 2003/0206095 A1 | 11/2003 | Chaloner et al. | |
| 2004/0001027 A1 | 1/2004 | Killen et al. | |
| 2004/0026519 A1 | 2/2004 | Usami et al. | |
| 2004/0056823 A1 | 3/2004 | Zuk et al. | |
| 2004/0066617 A1 | 4/2004 | Hirabayashi et al. | |
| 2004/0217915 A1 | 11/2004 | Imaizumi | |
| 2004/0219956 A1 | 11/2004 | Iwai et al. | |
| 2004/0227673 A1 | 11/2004 | Iwai et al. | |
| 2004/0252064 A1 | 12/2004 | Yuanzhu | |
| 2005/0001031 A1 | 1/2005 | Akiho et al. | |
| 2005/0007296 A1 | 1/2005 | Endo et al. | |
| 2005/0092836 A1 | 5/2005 | Kudo | |
| 2005/0099337 A1 | 5/2005 | Takei et al. | |
| 2005/0125093 A1 | 6/2005 | Kikuchi et al. | |
| 2005/0133605 A1 | 6/2005 | Koyama et al. | |
| 2005/0134460 A1 | 6/2005 | Usami | |
| 2005/0134506 A1 | 6/2005 | Egbert | |
| 2005/0138798 A1 | 6/2005 | Sakama et al. | |
| 2005/0140512 A1 | 6/2005 | Sakama et al. | |
| 2005/0162331 A1 | 7/2005 | Endo et al. | |
| 2005/0232412 A1 | 10/2005 | Ichihara et al. | |
| 2005/0236623 A1 | 10/2005 | Takechi et al. | |
| 2005/0253726 A1 | 11/2005 | Yoshida et al. | |
| 2005/0275539 A1 | 12/2005 | Sakama et al. | |
| 2006/0001138 A1 | 1/2006 | Sakama et al. | |
| 2006/0032926 A1 | 2/2006 | Baba et al. | |
| 2006/0044192 A1 | 3/2006 | Egbert | |
| 2006/0055531 A1 | 3/2006 | Cook et al. | |
| 2006/0055601 A1 | 3/2006 | Kameda et al. | |
| 2006/0071084 A1 | 4/2006 | Detig et al. | |
| 2006/0109185 A1 | 5/2006 | Iwai et al. | |
| 2006/0114159 A1 | 6/2006 | Yoshikawa et al. | |
| 2006/0145872 A1 | 7/2006 | Tanaka et al. | |
| 2006/0158380 A1 | 7/2006 | Son et al. | |
| 2006/0170606 A1 | 8/2006 | Yamagajo et al. | |
| 2006/0208900 A1 | 9/2006 | Tavassoli Hozouri | |
| 2006/0214801 A1 | 9/2006 | Murofushi et al. | |
| 2006/0220871 A1 | 10/2006 | Baba et al. | |
| 2006/0244568 A1 | 11/2006 | Tong et al. | |
| 2006/0244676 A1 | 11/2006 | Uesaka | |
| 2006/0267138 A1 | 11/2006 | Kobayashi | |
| 2007/0004028 A1 | 1/2007 | Lair et al. | |
| 2007/0015549 A1 | 1/2007 | Hernandez et al. | |
| 2007/0018893 A1 | 1/2007 | Kai et al. | |
| 2007/0040028 A1 | 2/2007 | Kawamata | |
| 2007/0052613 A1 | 3/2007 | Gallschuetz et al. | |
| 2007/0057854 A1 | 3/2007 | Oodachi et al. | |
| 2007/0069037 A1 | 3/2007 | Kawai | |
| 2007/0122960 A1 | 5/2007 | Aoki | |
| 2007/0132591 A1 | 6/2007 | Khatri | |
| 2007/0164414 A1 | 7/2007 | Dokai et al. | |
| 2007/0200705 A1 | 8/2007 | Yamagajo et al. | |
| 2007/0200782 A1 | 8/2007 | Hayama et al. | |
| 2007/0229276 A1 | 10/2007 | Yamagajo et al. | |
| 2007/0247387 A1 | 10/2007 | Kubo et al. | |
| 2007/0252700 A1 | 11/2007 | Ishihara et al. | |
| 2007/0252703 A1 | 11/2007 | Kato et al. | |
| 2007/0252763 A1 | 11/2007 | Martin | |
| 2007/0252770 A1 | 11/2007 | Kai et al. | |
| 2007/0285335 A1 | 12/2007 | Bungo et al. | |
| 2007/0290928 A1 | 12/2007 | Chang et al. | |
| 2007/0296555 A1 | 12/2007 | Kanno | |
| 2008/0024156 A1 | 1/2008 | Arai et al. | |
| 2008/0068132 A1 | 3/2008 | Kayanakis et al. | |
| 2008/0070003 A1 | 3/2008 | Nakatani et al. | |
| 2008/0074268 A1 | 3/2008 | Shafer | |
| 2008/0087990 A1 | 4/2008 | Kato et al. | |
| 2008/0111695 A1 | 5/2008 | Yamagajo et al. | |
| 2008/0129606 A1 | 6/2008 | Yanagisawa et al. | |
| 2008/0143630 A1 | 6/2008 | Kato et al. | |
| 2008/0169905 A1 | 7/2008 | Slatter | |
| 2008/0184281 A1 | 7/2008 | Ashizaki et al. | |
| 2008/0252551 A1 | 10/2008 | Kubo et al. | |
| 2008/0272885 A1 | 11/2008 | Atherton | |
| 2009/0002130 A1 * | 1/2009 | Kato | 340/10.1 |
| 2009/0008460 A1 | 1/2009 | Kato | |
| 2009/0009007 A1 | 1/2009 | Kato et al. | |
| 2009/0021352 A1 | 1/2009 | Kataya et al. | |

(56) References Cited

U.S. PATENT DOCUMENTS

| | | | |
|---|---|---|---|
| 2009/0021446 A1 | 1/2009 | Kataya et al. |
| 2009/0065594 A1 | 3/2009 | Kato et al. |
| 2009/0066466 A1 | 3/2009 | Arimura |
| 2009/0080296 A1 | 3/2009 | Dokai et al. |
| 2009/0096696 A1 | 4/2009 | Joyce, Jr. et al. |
| 2009/0109034 A1 | 4/2009 | Chen et al. |
| 2009/0109102 A1 | 4/2009 | Dokai et al. |
| 2009/0134979 A1 | 5/2009 | Tsukamoto et al. |
| 2009/0140947 A1 | 6/2009 | Sasagawa et al. |
| 2009/0159657 A1 | 6/2009 | Chen et al. |
| 2009/0160719 A1 | 6/2009 | Kato et al. |
| 2009/0201116 A1 | 8/2009 | Orihara |
| 2009/0224061 A1 | 9/2009 | Kato et al. |
| 2009/0231106 A1 | 9/2009 | Okamura |
| 2009/0262041 A1 | 10/2009 | Ikemoto et al. |
| 2009/0266900 A1 | 10/2009 | Ikemoto et al. |
| 2009/0278687 A1 | 11/2009 | Kato |
| 2009/0284220 A1 | 11/2009 | Toncich et al. |
| 2009/0321527 A1 | 12/2009 | Kato et al. |
| 2010/0103058 A1 | 4/2010 | Kato et al. |
| 2010/0182210 A1 | 7/2010 | Ryou et al. |
| 2010/0283694 A1 | 11/2010 | Kato |
| 2010/0308118 A1 | 12/2010 | Kataya et al. |
| 2011/0031320 A1 | 2/2011 | Kato et al. |
| 2011/0063184 A1 | 3/2011 | Furumura et al. |
| 2011/0080331 A1 | 4/2011 | Kato |
| 2011/0084146 A1 | 4/2011 | Owada |
| 2011/0186641 A1 | 8/2011 | Kato et al. |
| 2011/0253795 A1 | 10/2011 | Kato |
| 2012/0001701 A1 | 1/2012 | Taniguchi et al. |
| 2012/0325915 A1 | 12/2012 | Kato et al. |

FOREIGN PATENT DOCUMENTS

| | | | |
|---|---|---|---|
| CN | 101089879 A | 12/2007 |
| DE | 10 2006 057 369 A1 | 6/2008 |
| EP | 0 694 874 A2 | 1/1996 |
| EP | 0 848 448 A2 | 6/1998 |
| EP | 0 948 083 A2 | 10/1999 |
| EP | 0 977 145 A2 | 2/2000 |
| EP | 1 010 543 A1 | 6/2000 |
| EP | 1 085 480 A1 | 3/2001 |
| EP | 1 160 915 A2 | 12/2001 |
| EP | 1 170 795 A2 | 1/2002 |
| EP | 1 193 793 A2 | 4/2002 |
| EP | 1 227 540 A1 | 7/2002 |
| EP | 1 280 232 A1 | 1/2003 |
| EP | 1 280 350 A1 | 1/2003 |
| EP | 1 343 223 A1 | 9/2003 |
| EP | 1 357 511 A2 | 10/2003 |
| EP | 1 547 753 A1 | 6/2005 |
| EP | 1 548 872 A1 | 6/2005 |
| EP | 1 626 364 A2 | 2/2006 |
| EP | 1 701 296 A1 | 9/2006 |
| EP | 1 703 589 A1 | 9/2006 |
| EP | 1 742 296 A1 | 1/2007 |
| EP | 1 744 398 A1 | 1/2007 |
| EP | 1 840 802 A1 | 10/2007 |
| EP | 1 841 005 A1 | 10/2007 |
| EP | 1 865 574 A1 | 12/2007 |
| EP | 1 887 652 A1 | 2/2008 |
| EP | 1 976 056 A1 | 10/2008 |
| EP | 1 988 491 A1 | 11/2008 |
| EP | 1 988 601 A1 | 11/2008 |
| EP | 1 993 170 A1 | 11/2008 |
| EP | 2 009 738 A1 | 12/2008 |
| EP | 2 012 258 A1 | 1/2009 |
| EP | 2 096 709 A1 | 9/2009 |
| EP | 2 148 449 A1 | 1/2010 |
| EP | 2 166 617 A1 | 3/2010 |
| EP | 2 251 934 A1 | 11/2010 |
| EP | 2 256 861 A1 | 12/2010 |
| EP | 2 330 684 A1 | 6/2011 |
| GB | 2 305 075 A | 3/1997 |
| GB | 2461443 A | 1/2010 |
| GB | 2470299 A | 11/2010 |
| JP | 50-143451 A | 11/1975 |
| JP | 61-284102 A | 12/1986 |
| JP | 62-127140 U | 8/1987 |
| JP | 01-212035 A | 8/1989 |
| JP | 02-164105 A | 6/1990 |
| JP | 02-256208 A | 10/1990 |
| JP | 3-171385 A | 7/1991 |
| JP | 03-503467 A | 8/1991 |
| JP | 03-262313 A | 11/1991 |
| JP | 04-150011 A | 5/1992 |
| JP | 04-167500 A | 6/1992 |
| JP | 04-096814 U | 8/1992 |
| JP | 04-101168 U | 9/1992 |
| JP | 04-134807 U | 12/1992 |
| JP | 05-226926 A | 9/1993 |
| JP | 05-327331 A | 12/1993 |
| JP | 6-53733 A | 2/1994 |
| JP | 06-077729 A | 3/1994 |
| JP | 06-029215 U | 4/1994 |
| JP | 06-177635 A | 6/1994 |
| JP | 6-260949 A | 9/1994 |
| JP | 07-183836 A | 7/1995 |
| JP | 08-055725 A | 2/1996 |
| JP | 08-056113 A | 2/1996 |
| JP | 8-87580 A | 4/1996 |
| JP | 08-088586 A | 4/1996 |
| JP | 08-88586 A | 4/1996 |
| JP | 08-176421 A | 7/1996 |
| JP | 08-180160 A | 7/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-035025 A | 2/1997 |
| JP | 09-093029 A | 4/1997 |
| JP | 9-93029 A | 4/1997 |
| JP | 09-245381 A | 9/1997 |
| JP | 09-252217 A | 9/1997 |
| JP | 09-270623 A | 10/1997 |
| JP | 09-284038 A | 10/1997 |
| JP | 09-294374 A | 11/1997 |
| JP | 9-512367 A | 12/1997 |
| JP | 10-069533 A | 3/1998 |
| JP | 10-69533 A | 3/1998 |
| JP | 10-084406 A | 3/1998 |
| JP | 10-505466 A | 5/1998 |
| JP | 10-171954 A | 6/1998 |
| JP | 10-173427 A | 6/1998 |
| JP | 10-193849 A | 7/1998 |
| JP | 10-193851 A | 7/1998 |
| JP | 10-242742 A | 9/1998 |
| JP | 10-293828 A | 11/1998 |
| JP | 10-334203 A | 12/1998 |
| JP | 2834584 B2 | 12/1998 |
| JP | 11-4118 A | 1/1999 |
| JP | 11-025244 A | 1/1999 |
| JP | 11-039441 A | 2/1999 |
| JP | 11-075329 A | 3/1999 |
| JP | 11-085937 A | 3/1999 |
| JP | 11-88241 A | 3/1999 |
| JP | 11-102424 A | 4/1999 |
| JP | 11-103209 A | 4/1999 |
| JP | 11-149536 A | 6/1999 |
| JP | 11-149537 A | 6/1999 |
| JP | 11-149538 A | 6/1999 |
| JP | 11-175678 A | 7/1999 |
| JP | 11-219420 A | 8/1999 |
| JP | 11-220319 A | 8/1999 |
| JP | 11-282993 A | 10/1999 |
| JP | 11-328352 A | 11/1999 |
| JP | 11-331014 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2000-022421 A | 1/2000 |
| JP | 2000-048152 A | 2/2000 |
| JP | 2000-059260 A | 2/2000 |

(56) References Cited

FOREIGN PATENT DOCUMENTS

| | | |
|---|---|---|
| JP | 2000-085283 A | 3/2000 |
| JP | 2000-090207 A | 3/2000 |
| JP | 2000-132643 A | 5/2000 |
| JP | 2000-137778 A | 5/2000 |
| JP | 2000-137779 A | 5/2000 |
| JP | 2000-137785 A | 5/2000 |
| JP | 2000-148948 A | 5/2000 |
| JP | 2000-172812 A | 6/2000 |
| JP | 2000-209013 A | 7/2000 |
| JP | 2000-222540 A | 8/2000 |
| JP | 2000-510271 A | 8/2000 |
| JP | 2000-242754 A | 9/2000 |
| JP | 2000-243797 A | 9/2000 |
| JP | 2000-251049 A | 9/2000 |
| JP | 2000-261230 A | 9/2000 |
| JP | 2000-276569 A | 10/2000 |
| JP | 2000-286634 A | 10/2000 |
| JP | 2000-286760 A | 10/2000 |
| JP | 2000-311226 A | 11/2000 |
| JP | 2000-321984 A | 11/2000 |
| JP | 2000-349680 A | 12/2000 |
| JP | 2001-10264 A | 1/2001 |
| JP | 2001-028036 A | 1/2001 |
| JP | 2001-043340 A | 2/2001 |
| JP | 3075400 U | 2/2001 |
| JP | 2001-66990 A | 3/2001 |
| JP | 2001-76111 A | 3/2001 |
| JP | 2001-084463 A | 3/2001 |
| JP | 2001-101369 A | 4/2001 |
| JP | 2001-505682 A | 4/2001 |
| JP | 2001-168628 A | 6/2001 |
| JP | 2001-188890 A | 7/2001 |
| JP | 2001-209767 A | 8/2001 |
| JP | 2001-240046 A | 9/2001 |
| JP | 2001-240217 A | 9/2001 |
| JP | 2001-256457 A | 9/2001 |
| JP | 2001-257292 A | 9/2001 |
| JP | 2001-514777 A | 9/2001 |
| JP | 2001-291181 A | 10/2001 |
| JP | 2001-307049 A | 11/2001 |
| JP | 2001-319380 A | 11/2001 |
| JP | 2001-331976 A | 11/2001 |
| JP | 2001-332923 A | 11/2001 |
| JP | 2001-339226 A | 12/2001 |
| JP | 2001-344574 A | 12/2001 |
| JP | 2001-351083 A | 12/2001 |
| JP | 2001-351084 A | 12/2001 |
| JP | 2001-352176 A | 12/2001 |
| JP | 2001-358527 A | 12/2001 |
| JP | 2002-024776 A | 1/2002 |
| JP | 2002-026513 A | 1/2002 |
| JP | 2002-32731 A | 1/2002 |
| JP | 2002-042076 A | 2/2002 |
| JP | 2002-042083 A | 2/2002 |
| JP | 2002-063557 A | 2/2002 |
| JP | 2002-505645 A | 2/2002 |
| JP | 2002-076750 A | 3/2002 |
| JP | 2002-76750 A | 3/2002 |
| JP | 2002-111363 A | 4/2002 |
| JP | 2002-143826 A | 5/2002 |
| JP | 2002-150245 A | 5/2002 |
| JP | 2002-157564 A | 5/2002 |
| JP | 2002-158529 A | 5/2002 |
| JP | 2002-175508 A | 6/2002 |
| JP | 2002-175920 A | 6/2002 |
| JP | 2002-183676 A | 6/2002 |
| JP | 2002-183690 A | 6/2002 |
| JP | 2002-185358 A | 6/2002 |
| JP | 2002-204117 A | 7/2002 |
| JP | 2002-521757 A | 7/2002 |
| JP | 2002-522849 A | 7/2002 |
| JP | 2002-222398 A | 8/2002 |
| JP | 2002-230128 A | 8/2002 |
| JP | 2002-232221 A | 8/2002 |
| JP | 2002-245416 A | 8/2002 |
| JP | 2002-246828 A | 8/2002 |
| JP | 2002-252117 A | 9/2002 |
| JP | 2002-259934 A | 9/2002 |
| JP | 2002-280821 A | 9/2002 |
| JP | 2002-290130 A | 10/2002 |
| JP | 2002-298109 A | 10/2002 |
| JP | 2002-308437 A | 10/2002 |
| JP | 2002-319008 A | 10/2002 |
| JP | 2002-319009 A | 10/2002 |
| JP | 2002-319812 A | 10/2002 |
| JP | 2002-324221 A | 11/2002 |
| JP | 2002-325013 A | 11/2002 |
| JP | 2002-362613 A | 12/2002 |
| JP | 2002-366917 A | 12/2002 |
| JP | 2002-373029 A | 12/2002 |
| JP | 2002-373323 A | 12/2002 |
| JP | 2002-374139 A | 12/2002 |
| JP | 2003-006599 A | 1/2003 |
| JP | 2003-016412 A | 1/2003 |
| JP | 2003-022912 A | 1/2003 |
| JP | 2003-026177 A | 1/2003 |
| JP | 2003-030612 A | 1/2003 |
| JP | 2003-037861 A | 2/2003 |
| JP | 2003-44789 A | 2/2003 |
| JP | 2003-046318 A | 2/2003 |
| JP | 2003-58840 A | 2/2003 |
| JP | 2003-067711 A | 3/2003 |
| JP | 2003-069335 A | 3/2003 |
| JP | 2003-076947 A | 3/2003 |
| JP | 2003-76963 A | 3/2003 |
| JP | 2003-78333 A | 3/2003 |
| JP | 2003-078336 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099184 A | 4/2003 |
| JP | 2003-099720 A | 4/2003 |
| JP | 2003-099721 A | 4/2003 |
| JP | 2003-108966 A | 4/2003 |
| JP | 2003-110344 A | 4/2003 |
| JP | 2003-132330 A | 5/2003 |
| JP | 2003-134007 A | 5/2003 |
| JP | 2003-139866 A | 5/2003 |
| JP | 2003-155062 A | 5/2003 |
| JP | 2003-158414 A | 5/2003 |
| JP | 2003-168760 A | 6/2003 |
| JP | 2003-179565 A | 6/2003 |
| JP | 2003-187207 A | 7/2003 |
| JP | 2003-187211 A | 7/2003 |
| JP | 2003-188338 A | 7/2003 |
| JP | 2003-188620 A | 7/2003 |
| JP | 2003-198230 A | 7/2003 |
| JP | 2003-209421 A | 7/2003 |
| JP | 2003-216919 A | 7/2003 |
| JP | 2003-218624 A | 7/2003 |
| JP | 2003-233780 A | 8/2003 |
| JP | 2003-242471 A | 8/2003 |
| JP | 2003-243918 A | 8/2003 |
| JP | 2003-249813 A | 9/2003 |
| JP | 2003-529163 A | 9/2003 |
| JP | 2003-288560 A | 10/2003 |
| JP | 2003-308363 A | 10/2003 |
| JP | 2003-309418 A | 10/2003 |
| JP | 2003-317055 A | 11/2003 |
| JP | 2003-317060 A | 11/2003 |
| JP | 2003-331246 A | 11/2003 |
| JP | 2003-332820 A | 11/2003 |
| JP | 2003-536302 A | 12/2003 |
| JP | 2004-040597 A | 2/2004 |
| JP | 2004-505481 A | 2/2004 |
| JP | 2004-082775 A | 3/2004 |
| JP | 2004-88218 A | 3/2004 |
| JP | 2004-93693 A | 3/2004 |
| JP | 2004-096566 A | 3/2004 |
| JP | 2004-096618 A | 3/2004 |
| JP | 2004-506905 A | 3/2004 |
| JP | 2004-104344 A | 4/2004 |
| JP | 2004-121412 A | 4/2004 |

(56) References Cited

FOREIGN PATENT DOCUMENTS

| | | |
|---|---|---|
| JP | 2004-126750 A | 4/2004 |
| JP | 2004-127230 A | 4/2004 |
| JP | 2004-140513 A | 5/2004 |
| JP | 2004-145449 A | 5/2004 |
| JP | 2004-163134 A | 6/2004 |
| JP | 2004-166175 A | 6/2004 |
| JP | 2004-166176 A | 6/2004 |
| JP | 2004-172919 A | 6/2004 |
| JP | 2004-213582 A | 7/2004 |
| JP | 2004-519916 A | 7/2004 |
| JP | 2004/070879 A | 8/2004 |
| JP | 2004-234595 A | 8/2004 |
| JP | 2004-253858 A | 9/2004 |
| JP | 2004-527864 A | 9/2004 |
| JP | 2004-280390 A | 10/2004 |
| JP | 2004-282403 A | 10/2004 |
| JP | 2004-287767 A | 10/2004 |
| JP | 2004-295297 A | 10/2004 |
| JP | 2004-297249 A | 10/2004 |
| JP | 2004-297681 A | 10/2004 |
| JP | 2004-304370 A | 10/2004 |
| JP | 2004-319848 A | 11/2004 |
| JP | 2004-326380 A | 11/2004 |
| JP | 2004-334268 A | 11/2004 |
| JP | 2004-336250 A | 11/2004 |
| JP | 2004-336604 A | 11/2004 |
| JP | 2004-343000 A | 12/2004 |
| JP | 2004-362190 A | 12/2004 |
| JP | 2004-362341 A | 12/2004 |
| JP | 2004-362602 A | 12/2004 |
| JP | 2005-5866 A | 1/2005 |
| JP | 2005-006096 A | 1/2005 |
| JP | 2005-18156 A | 1/2005 |
| JP | 2005-033461 A | 2/2005 |
| JP | 2005-050581 A | 2/2005 |
| JP | 2005-064799 A | 3/2005 |
| JP | 2005-124061 A | 5/2005 |
| JP | 2005-128592 A | 5/2005 |
| JP | 2005-129019 A | 5/2005 |
| JP | 2005-134942 A | 5/2005 |
| JP | 2005-135132 A | 5/2005 |
| JP | 2005-136528 A | 5/2005 |
| JP | 2005-137032 A | 5/2005 |
| JP | 3653099 B2 | 5/2005 |
| JP | 2005-165839 A | 6/2005 |
| JP | 2005-167327 A | 6/2005 |
| JP | 2005-167813 A | 6/2005 |
| JP | 2005-190417 A | 7/2005 |
| JP | 2005-191705 A | 7/2005 |
| JP | 2005-192124 A | 7/2005 |
| JP | 2005-202943 A | 7/2005 |
| JP | 2005-204038 A | 7/2005 |
| JP | 2005-210223 A | 8/2005 |
| JP | 2005-210676 A | 8/2005 |
| JP | 2005-210680 A | 8/2005 |
| JP | 2005-217822 A | 8/2005 |
| JP | 2005-229474 A | 8/2005 |
| JP | 2005-236339 A | 9/2005 |
| JP | 2005-244778 A | 9/2005 |
| JP | 2005-252853 A | 9/2005 |
| JP | 2005-275870 A | 10/2005 |
| JP | 2005-277579 A | 10/2005 |
| JP | 2005-284352 A | 10/2005 |
| JP | 2005-284455 A | 10/2005 |
| JP | 2005-293537 A | 10/2005 |
| JP | 2005-295135 A | 10/2005 |
| JP | 2005-306696 A | 11/2005 |
| JP | 2005-311205 A | 11/2005 |
| JP | 2005-321305 A | 11/2005 |
| JP | 2005-322119 A | 11/2005 |
| JP | 2005-327622 A | 11/2005 |
| JP | 2005-328259 A | 11/2005 |
| JP | 2005-333244 A | 12/2005 |
| JP | 2005-335755 A | 12/2005 |
| JP | 2005-340759 A | 12/2005 |
| JP | 2005-345802 A | 12/2005 |
| JP | 2005-346820 A | 12/2005 |
| JP | 2005-352858 A | 12/2005 |
| JP | 2006-13976 A | 1/2006 |
| JP | 2006-013976 A | 1/2006 |
| JP | 2006-025390 A | 1/2006 |
| JP | 2006-031766 A | 2/2006 |
| JP | 2006-033312 A | 2/2006 |
| JP | 2006-39902 A | 2/2006 |
| JP | 2006-039947 A | 2/2006 |
| JP | 2006-42059 A | 2/2006 |
| JP | 2006-42097 A | 2/2006 |
| JP | 2006-050200 A | 2/2006 |
| JP | 2006-053833 A | 2/2006 |
| JP | 2006-67479 A | 3/2006 |
| JP | 2006-72706 A | 3/2006 |
| JP | 2006-074348 A | 3/2006 |
| JP | 2006-80367 A | 3/2006 |
| JP | 2006-92630 A | 4/2006 |
| JP | 2006-102953 A | 4/2006 |
| JP | 2006-107296 A | 4/2006 |
| JP | 2006-513594 A | 4/2006 |
| JP | 2006-148462 A | 6/2006 |
| JP | 2006-148518 A | 6/2006 |
| JP | 2006-151402 A | 6/2006 |
| JP | 2006-174151 A | 6/2006 |
| JP | 2006-195795 A | 7/2006 |
| JP | 2006-203187 A | 8/2006 |
| JP | 2006-203852 A | 8/2006 |
| JP | 2006-217000 A | 8/2006 |
| JP | 2006-232292 A | 9/2006 |
| JP | 2006-237674 A | 9/2006 |
| JP | 2006-238282 A | 9/2006 |
| JP | 2006-246372 A | 9/2006 |
| JP | 2006-270212 A | 10/2006 |
| JP | 2006-270681 A | 10/2006 |
| JP | 2006-270766 A | 10/2006 |
| JP | 2006-285911 A | 10/2006 |
| JP | 2006-287659 A | 10/2006 |
| JP | 2006-295879 A | 10/2006 |
| JP | 2006-302219 A | 11/2006 |
| JP | 2006-309401 A | 11/2006 |
| JP | 2006-311239 A | 11/2006 |
| JP | 2006-323481 A | 11/2006 |
| JP | 2006-339964 A | 12/2006 |
| JP | 2007-007888 A | 1/2007 |
| JP | 2007-013120 A | 1/2007 |
| JP | 2007-13120 A | 1/2007 |
| JP | 2007-18067 A | 1/2007 |
| JP | 2007-019905 A | 1/2007 |
| JP | 2007-028002 A | 2/2007 |
| JP | 2007-28002 A | 2/2007 |
| JP | 2007-040702 A | 2/2007 |
| JP | 2007-043535 A | 2/2007 |
| JP | 2007-048126 A | 2/2007 |
| JP | 2007-65822 A | 3/2007 |
| JP | 2007-068073 A | 3/2007 |
| JP | 2007-79687 A | 3/2007 |
| JP | 2007-81712 A | 3/2007 |
| JP | 2007-096655 A | 4/2007 |
| JP | 2007-096768 A | 4/2007 |
| JP | 2007-102348 A | 4/2007 |
| JP | 2007-116347 A | 5/2007 |
| JP | 2007-122542 A | 5/2007 |
| JP | 2007-149757 A | 6/2007 |
| JP | 2007-150642 A | 6/2007 |
| JP | 2007-150868 A | 6/2007 |
| JP | 2007-159083 A | 6/2007 |
| JP | 2007-159129 A | 6/2007 |
| JP | 2007-166133 A | 6/2007 |
| JP | 3975918 B2 | 6/2007 |
| JP | 2007-172369 A | 7/2007 |
| JP | 2007-172527 A | 7/2007 |
| JP | 2007-194924 A | 8/2007 |
| JP | 2007-524942 A | 8/2007 |
| JP | 2007-228254 A | 9/2007 |
| JP | 2007-228325 A | 9/2007 |
| JP | 2007-228437 A | 9/2007 |
| JP | 2007-233597 A | 9/2007 |

(56) References Cited

FOREIGN PATENT DOCUMENTS

| | | |
|---|---|---|
| JP | 2007-241789 A | 9/2007 |
| JP | 2007-249620 A | 9/2007 |
| JP | 2007-266999 A | 10/2007 |
| JP | 2007-272264 A | 10/2007 |
| JP | 2007-279782 A | 10/2007 |
| JP | 2007-287128 A | 11/2007 |
| JP | 2007-295177 A | 11/2007 |
| JP | 2007-295395 A | 11/2007 |
| JP | 2007-295557 A | 11/2007 |
| JP | 2007-312350 A | 11/2007 |
| JP | 2007-324865 A | 12/2007 |
| JP | 2008-033716 A | 2/2008 |
| JP | 2008-042379 A | 2/2008 |
| JP | 2008-042910 A | 2/2008 |
| JP | 2008-72243 A | 3/2008 |
| JP | 2008-083867 A | 4/2008 |
| JP | 2008-092131 A | 4/2008 |
| JP | 2008-097426 A | 4/2008 |
| JP | 2008-098993 A | 4/2008 |
| JP | 4069958 B2 | 4/2008 |
| JP | 2008-103691 A | 5/2008 |
| JP | 2008-107947 A | 5/2008 |
| JP | 2008-118359 A | 5/2008 |
| JP | 2008-513888 A | 5/2008 |
| JP | 2008-148345 A | 6/2008 |
| JP | 2008-519347 A | 6/2008 |
| JP | 2008-160821 A | 7/2008 |
| JP | 2008-160874 A | 7/2008 |
| JP | 2008-167190 A | 7/2008 |
| JP | 2008-176626 A | 7/2008 |
| JP | 2008-182438 A | 8/2008 |
| JP | 2008-197714 A | 8/2008 |
| JP | 2008-535372 A | 8/2008 |
| JP | 2008-207875 A | 9/2008 |
| JP | 2008-211572 A | 9/2008 |
| JP | 2008-217406 A | 9/2008 |
| JP | 2008-226099 A | 9/2008 |
| JP | 2008226099 A * | 9/2008 |
| JP | 2008-244739 A | 10/2008 |
| JP | 2008-252517 A | 10/2008 |
| JP | 2008-288915 A | 11/2008 |
| JP | 2008-294491 A | 12/2008 |
| JP | 2009-017284 A | 1/2009 |
| JP | 2009-021970 A | 1/2009 |
| JP | 2009-25870 A | 2/2009 |
| JP | 2009-027291 A | 2/2009 |
| JP | 2009-27291 A | 2/2009 |
| JP | 2009-037413 A | 2/2009 |
| JP | 2009-044647 A | 2/2009 |
| JP | 2009-044715 A | 2/2009 |
| JP | 3148168 U | 2/2009 |
| JP | 2009-065426 A | 3/2009 |
| JP | 2009-110144 A | 5/2009 |
| JP | 2009-111950 A | 5/2009 |
| JP | 2009-111986 A | 5/2009 |
| JP | 2009-130896 A | 6/2009 |
| JP | 2009-135166 A | 6/2009 |
| JP | 2009-524363 A | 6/2009 |
| JP | 2009-153166 A | 7/2009 |
| JP | 4301346 B2 | 7/2009 |
| JP | 2009-181246 A | 8/2009 |
| JP | 2009-182630 A | 8/2009 |
| JP | 2009-213169 A | 9/2009 |
| JP | 2009-213171 A | 9/2009 |
| JP | 2009-260758 A | 11/2009 |
| JP | 2009-278441 A | 11/2009 |
| JP | 2009-284182 A | 12/2009 |
| JP | 2010-009196 A | 1/2010 |
| JP | 2010-015342 A | 1/2010 |
| JP | 2010-504598 A | 2/2010 |
| JP | 2010-050844 A | 3/2010 |
| JP | 2010-051012 A | 3/2010 |
| JP | 2010-051017 A | 3/2010 |
| JP | 2010-56998 A | 3/2010 |
| JP | 2010-074839 A | 4/2010 |
| JP | 2010-081571 | 4/2010 |
| JP | 2010-102445 A | 5/2010 |
| JP | 2010-171857 A | 8/2010 |
| JP | 4535209 B2 | 9/2010 |
| JP | 4561932 B2 | 10/2010 |
| JP | 2010-268306 A | 11/2010 |
| JP | 2010-279029 A | 12/2010 |
| JP | 2011-015395 A | 1/2011 |
| JP | 4609604 B2 | 1/2011 |
| JP | 2011-076567 A | 4/2011 |
| JP | 2011-87025 A | 4/2011 |
| JP | 2011-139533 A | 7/2011 |
| JP | 2011-142648 A | 7/2011 |
| JP | 2011-205384 A | 10/2011 |
| JP | 2012-033021 A | 2/2012 |
| JP | 5403145 B2 | 11/2013 |
| JP | 5403146 B2 | 11/2013 |
| NL | 9100176 A | 3/1992 |
| NL | 9100347 A | 3/1992 |
| WO | 98/33142 A1 | 7/1998 |
| WO | 99/67754 A1 | 12/1999 |
| WO | 00/10122 A2 | 2/2000 |
| WO | 01/95242 A2 | 12/2001 |
| WO | 02/48980 A1 | 6/2002 |
| WO | 02/061675 A1 | 8/2002 |
| WO | 02/097723 A1 | 12/2002 |
| WO | 03/079305 A1 | 9/2003 |
| WO | 2004/036772 A2 | 4/2004 |
| WO | 2004/070879 A | 8/2004 |
| WO | 2004/072892 A2 | 8/2004 |
| WO | 2005/073937 A | 8/2005 |
| WO | 2005/091434 A1 | 9/2005 |
| WO | 2005/115849 A1 | 12/2005 |
| WO | 2006/045682 A | 5/2006 |
| WO | 2006/048663 A1 | 5/2006 |
| WO | 2006/049068 A1 | 5/2006 |
| WO | 2006/114821 A1 | 11/2006 |
| WO | 2007/013168 A1 | 2/2007 |
| WO | 2007/060792 A1 | 5/2007 |
| WO | 2007/083574 A1 | 7/2007 |
| WO | 2007/083575 A1 | 7/2007 |
| WO | 2007/086130 A1 | 8/2007 |
| WO | 2007/094494 A1 | 8/2007 |
| WO | 2007/097385 A1 | 8/2007 |
| WO | 2007/099602 A1 | 9/2007 |
| WO | 2007/100092 A1 | 9/2007 |
| WO | 2007/102360 A1 | 9/2007 |
| WO | 2007/105348 A1 | 9/2007 |
| WO | 2007/119310 A1 | 10/2007 |
| WO | 2007/125683 A1 | 11/2007 |
| WO | 2007/132094 A1 | 11/2007 |
| WO | 2007/138857 A1 | 12/2007 |
| WO | 2008/001561 A1 | 1/2008 |
| WO | 2008/007606 A | 1/2008 |
| WO | 2008/081699 A1 | 7/2008 |
| WO | 2008/126458 A1 | 10/2008 |
| WO | 2008/133018 A1 | 11/2008 |
| WO | 2008/140037 A1 | 11/2008 |
| WO | 2008/142957 A1 | 11/2008 |
| WO | 2009/005080 A1 | 1/2009 |
| WO | 2009/008296 A1 | 1/2009 |
| WO | 2009/011144 A1 | 1/2009 |
| WO | 2009/011154 A1 | 1/2009 |
| WO | 2009/011376 A1 | 1/2009 |
| WO | 2009/011400 A1 | 1/2009 |
| WO | 2009/011423 A1 | 1/2009 |
| WO | 2009/048767 A1 | 4/2009 |
| WO | 2009/081719 A1 | 7/2009 |
| WO | 2009/110381 A1 | 9/2009 |
| WO | 2009/119548 A1 | 10/2009 |
| WO | 2009/128437 A1 | 10/2009 |
| WO | 2009/140220 A1 | 11/2009 |
| WO | 2009/142114 A1 | 11/2009 |
| WO | 2010/026939 A1 | 3/2010 |
| WO | 2010/050361 A1 | 5/2010 |
| WO | 2010/079830 A1 | 7/2010 |
| WO | 2010/104179 A1 | 9/2010 |
| WO | 2010/119854 A1 | 10/2010 |
| WO | 2011/062274 A1 | 5/2011 |

(56) References Cited

FOREIGN PATENT DOCUMENTS

OTHER PUBLICATIONS

H. D. Merchant, G. Khatibi, B. Weiss. "Elastic and elastoplastic response of thin copper foil." Journal of Materials Science, 2004, vol. 39, No. 13, p. 4157.*
Official Communication issued in corresponding Japanese Patent Application No. 2012-503048, dated Mar. 18, 2014.
Official Communication issued in corresponding Chinese Patent Application No. 201180012161.7, dated Jul. 30, 2014.
Official communication issued in Japanese Application No. 2007-531524, dated Sep. 11, 2007.
Official communication issued in Japanese Application No. 2007-531525, dated Sep. 25, 2007.
Official communication issued in Japanese Application No. 2007-531524, dated Dec. 12, 2007.
Official communication issued in European Application No. 07706650.4, dated Nov. 24, 2008.
Mukku-Sha, "Musen IC Tagu Katsuyo-no Subete" "(All About Wireless IC Tags")", RFID, pp. 112-126.
Dokai et al.: "Wireless IC Device and Component for Wireless IC Device"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399; dated Aug. 25, 2008.
English translation of NL9100176, published on Mar. 2, 1992.
English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.
Kato et al.: "Antenna"; U.S. Appl. No. 11/688,290, filed Mar. 20, 2007.
Kato et al.: "Electromagnetic-Coupling-Module—Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19, 2008.
Ikemoto et al.: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Official Communication issued in International Application No. PCT/JP2007/066007, dated Nov. 27, 2007.
Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, dated Sep. 30, 2008.
Official Communication issued in International Application No. PCT/JP2007/066721, dated Nov. 27, 2007.
Official Communication issued in International Application No. PCT/JP2007/070460, dated Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, dated May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, dated Jul. 22, 2008.
Kato et al.: "Container With Electromagnetic Coupling Module"; U.S. Appl. No. 12/426,369, filed Apr. 20, 2009.
Kato: "Wireless IC Device"; U.S. Appl. No. 12/429,346, filed Apr. 24, 2009.
Official communication issued in counterpart International Application No. PCT/JP2008/071502, dated Feb. 24, 2009.
Kato et al.: "Wireless IC Device and Manufacturing Method Thereof," U.S. Appl. No. 12/432,854, filed Apr. 30, 2009.
Official communication issued in counterpart International Application No. PCT/JP2008/058168, dated Aug. 12, 2008.
Official communication issued in counterpart International Application No. PCT/JP2008/062886, dated Oct. 21, 2008.
Kato et al.: "Wireless IC Device," U.S. Appl. No. 12/469,896, filed May 21, 2009.
Ikemoto et al.: "Wireless IC Device," U.S. Appl. No. 12/496,709, filed Jul. 2, 2009.
Official communication issued in counterpart International Application No. PCT/JP2008/062947, dated Aug. 19, 2008.
Official communication issued in counterpart International Application No. PCT/JP2008/056026, dated Jul. 1, 2008.
Ikemoto et al.: "Wireless IC Device and Electronic Apparatus," U.S. Appl. No. 12/503,188, filed Jul. 15, 2009.
Official communication issued in counterpart International Application No. PCT/JP2008/055567, dated May 20, 2008.
Official communication issued in counterpart International Application No. PCT/JP2008/051853, dated Apr. 22, 2008.
Official communication issued in counterpart International Application No. PCT/JP2008/057239, dated Jul. 22, 2008.
Kimura et al.: "Wireless IC Device," U.S. Appl. No. 12/510,338, filed Jul. 28, 2009.
Kato et al.: "Wireless IC Device," U.S. Appl. No. 12/510,340, filed Jul. 28, 2009.
Kato: "Wireless IC Device," U.S. Appl. No. 12/510,344, filed Jul. 28, 2009.
Kato et al.: "Wireless IC Device," U.S. Appl. No. 12/510,347, filed Jul. 28, 2009.
Official Communication issued in International Patent Application No. PCT/JP2008/063025, dated Aug. 12, 2008.
Kato et al.: "Wireless IC Device," U.S. Appl. No. 12/603,608, filed Oct. 22, 2009.
Kato et al.: "Wireless IC Device," U.S. Appl. No. 12/688,072, filed Jan. 15. 2010.
Official Communication issued in International Patent Application No. PCT/JP2009/053693, dated Jun. 9, 2009.
Kato: "Composite Antenna," U.S. Appl. No. 12/845,846, filed Jul. 29, 2010.
Official Communication issued in International Patent Application No. PCT/JP2009/053690, dated Jun. 2, 2009.
Kato et al.: "Radio Frequency IC Device and Radio Communication System," U.S. Appl. No. 12/859,340, filed Aug. 19, 2010.
Official Communication issued in International Patent Application No. PCT/JP2009/055758, dated Jun. 23, 2009.

(56) References Cited

OTHER PUBLICATIONS

Kato et al.: "Wireless IC Device," U.S. Appl. No. 12/859,880, filed Aug. 20, 2010.
Official Communication issued in International Patent Application No. PCT/JP2009/057482, dated Jul. 21, 2009.
Kataya et al.: "Wireless IC Device, Electronic Apparatus, and Method for Adjusting Resonant Frequency of Wireless IC Device," U.S. Appl. No. 12/861,945, filed Aug. 24, 2010.
Kato: "Wireless IC Device and Electromagnetic Coupling Module," U.S. Appl. No. 12/890,895, filed Sep. 27, 2010.
Official Communication issued in International Patent Application No. PCT/JP2009/059410, dated Aug. 4, 2009.
Kato et al.: "Wireless IC Device" U.S. Appl. No. 12/902,174, filed Oct. 12, 2010.
Official Communication issued in International Patent Application No. PCT/JP2009/059259, dated Aug. 11, 2009.
Official Communication issued in corresponding Japanese Patent Application No. 2010-506742, dated Apr. 6, 2010.
Official Communication issued in International Patent Application No. PCT/JP2009/056698, dated Jul. 7, 2009.
Official Communication issued in International Patent Application No. PCT/JP2009/056934, dated Jun. 30, 2009.
Kato et al.: "Wireless IC Device"; U.S. Appl. No. 12/903,242, filed Oct. 13, 2010.
Kato et al.: "Wireless IC Device"; U.S. Appl. No. 12/940,103, filed Nov. 5, 2010.
Kato et al.: "Wireless IC Device System and Method of Determining Authenticity of Wireless Device"; U.S. Appl. No. 12/940,105, filed Nov. 5, 2010.
Official Communication issued in International Patent Application No. PCT/JP2009/059669, dated Aug. 25, 2009.
Official Communication issued in International Patent Application No. PCT/JP2009/062181, dated Oct. 13, 2009.
Official Communication issued in corresponding Japanese Application No. 2010-501323, dated Apr. 6, 2010.
Kato et al.: "Component of Wireless IC Device and Wireless IC Device"; U.S. Appl. No. 12/944,099, filed Nov. 11, 2010.
Kato et al.: Wireless IC Device and Manufacturing Method Thereof; U.S. Appl. No. 12/961,599, filed Dec. 7, 2010.
Kataya et al.: "Radio Frequency IC Device and Electronic Apparatus"; U.S. Appl. No. 12/959,454, filed Dec. 3, 2010.
Ikemoto et al.: "Radio IC Device"; U.S. Appl. No. 12/981,582, filed Dec. 30, 2010.
Official Communication issued in International Patent Application No. PCT/JP2009/062801, dated Oct. 27, 2009.
Ikemoto et al.: "Wireless IC Device and Electronic Apparatus"; U.S. Appl. No. 13/022,695, filed Feb. 8, 2011.
Official Communication issued in International Patent Application No. PCT/JP2009/067778, dated Jan. 26, 2010.
Kato: "Wireless IC Device and Method for Manufacturing Same"; U.S. Appl. No. 13/022,693, filed Feb. 8, 2011.
Kato: "Wireless IC Device"; U.S. Appl. No. 13/080,781, filed Apr. 6, 2011.
Official Communication issued in International Patent Application No. PCT/JP2009/069486, dated Mar. 2, 2010.
Kato: "Radio IC Device"; U.S. Appl. No. 13/080,775, filed Apr. 6, 2011.
Kato et al.: "Antenna and Wireless IC Device"; U.S. Appl. No. 13/083,626, filed Apr. 11, 2011.
Official Communication issued in International Patent Application No. PCT/JP2009/070617, dated Mar. 16, 2010.
Nagai, "Mounting Technique of RFID by Roll-To-Roll Process", Material Stage, Technical Information Institute Co., LTD, vol. 7, No. 9, 2007, pp. 4-12.
Dokai et al.: "Wireless IC Device"; U.S. Appl. No. 13/088,480, filed Apr. 18, 2011.
Kato et al.: "High-Frequency Device and Wireless IC Device"; U.S. Appl. No. 13/094,928, filed Apr. 27, 2011.
Dokai et al.: "Wireless IC Device"; U.S. Appl. No. 13/099,392, filed May 3, 2011.
Kato et al.: "Radio Frequency IC Device"; U.S. Appl. No. 13/163,803, filed Jun. 20, 2011.
Official Communication issued in International Patent Application No. PCT/JP2010/050170, dated Apr. 13, 2010.
Official Communication issued in International Patent Application No. PCT/JP2010/051205, dated May 11, 2010.
Kato: "Wireless IC Device, Wireless IC Module and Method of Manufacturing Wireless IC Module"; U.S. Appl. No. 13/169,067, filed Jun. 27, 2011.
Kato et al.: "Antenna and Wireless IC Device"; U.S. Appl. No. 13/190,670, filed Jul. 26, 2011.
Shiroki et al.: "RFIC Chip Mounting Structure"; U.S. Appl. No. 13/223,429, filed Sep. 1, 2011.
Official Communication issued in International Patent Application No. PCT/JP2010/056559, dated Jul. 27, 2010.
Taniguchi et al.: "Antenna Device and Radio Frequency IC Device"; U.S. Appl. No. 13/232,102, filed Sep. 14, 2011.
Official communication issued in counterpart European Application No. 08 77 7758, dated Jun. 30, 2009.
Official communication issued in counterpart Japanese Application No. 2008-103741, dated May 26, 2009.
Official communication issued in counterpart Japanese Application No. 2008-103742, dated May 26, 2009.
Official communication issued in International Application No. PCT/JP2008/050358, dated Mar. 25, 2008.
Official communication issued in International Application No. PCT/JP2008/050356, dated Mar. 25, 2008.
Osamura et al.: "Packaging Material With Electromagnetic Coupling Module,"; U.S. Appl. No. 12/536,664, filed Aug. 6, 2009.
Osamura et al.: "Packaging Material With Electromagnetic Coupling Module,"; U.S. Appl. No. 12/536,689, filed Aug. 6, 2009.
Dokai et al.: "Wireless IC Device and Component for Wireless IC Device,"; U.S. Appl. No. 12/543,553, filed Aug. 19, 2009.
Shioya et al.: "Wireless IC Device,"; U.S. Appl. No. 12/551,037, filed Aug. 31, 2009.
Ikemoto: "Wireless IC Device and Manufacturing Method Thereof,"; U.S. Appl. No. 12/579,672, filed Oct. 15, 2009.
Official communication issued in International Application No. PCT/JP2008/058614, dated Jun. 10, 2008.
Official Communication issued in International Patent Application No. PCT/JP2011/068110, dated Sep. 20, 2011.
Dokai et al.: "Antenna and Wireless Communication Device"; U.S. Appl. No. 13/613,021, filed Sep. 13, 2012.
Takeoka et al.: "Printed Wiring Board and Wireless Communication System"; U.S. Appl. No. 13/616,140, filed Sep. 14, 2012.
Dokai: "Wireless IC Device, Wireless IC Module and Method of Manufacturing Wireless IC Module"; U.S. Appl. No. 13/688,287, filed Nov. 29, 2012.
Official Communication issued in International Patent Application No. PCT/JP2011/067127, dated Oct. 18, 2011.
Kato et al.: "Wireless Communication Device and Metal Article"; U.S. Appl. No. 13/691,996, filed Dec. 3, 2012.
Yosui: "Antenna Apparatus and Communication Terminal Instrument"; U.S. Appl. No. 13/706,409, filed Dec. 6, 2012.
Official Communication issued in International Patent Application No. PCT/JP2011/071795, dated Dec. 27, 2011.
Dokai et al.: "Wireless IC Device"; U.S. Appl. No. 13/738,143, filed Jan. 10, 2013.
Official Communication issued in International Patent Application No. PCT/JP2011/074009, dated Dec. 20, 2011.
Kato et al.: "Electromagnetic-Coupling-Module-Attached Article"; U.S. Appl. No. 13/754,972, filed Jan. 31, 2013.
Kimura et al.: "Electrical Product"; U.S. Appl. No. 13/757,991, filed Feb. 4, 2013.
Nakano et al.: "Communication Terminal Device"; U.S. Appl. No. 13/760,196, filed Feb. 6, 2013.
Official Communication issued in International Patent Application No. PCT/JP2011/073054, dated Dec. 20, 2011.
Official Communication issued in International Patent Application No. PCT/JP2011/073490, dated Jan. 10, 2012.
Kato et al.: "Antenna Device and Communication Terminal Apparatus"; U.S. Appl. No. 13/761,195, filed Feb. 7, 2013.

(56) References Cited

OTHER PUBLICATIONS

Kato et al.: "Antenna Device and Mobile Communication Terminal"; U.S. Appl. No. 13/767,960, filed Feb. 15, 2013.
Official Communication issued in International Patent Application No. PCT/JP2012/058884, dated Jun. 12, 2012.
Dokai et al.: "Wireless Communication Device"; U.S. Appl. No. 13/782,346, filed Mar. 1, 2013.
Official Communication issued in International Patent Application No. PCT/JP2012/053344, dated May 22, 2012.
Official Communication issued in International Patent Application No. PCT/JP2009/066336, dated Dec. 22, 2009.
Official Communication issued in corresponding Japanese Patent Application No. 2010-509439, dated Jul. 6, 2010.
Official Communication issued in corresponding Japanese Patent Application No. 2011-032311, dated Mar. 29, 2011.
Official Communication issued in corresponding Japanese Patent Application No. 2009-525327, dated Sep. 22, 2010.
Official Communication issued in corresponding Japanese Patent Application No. 2011-032311, dated Aug. 2, 2011.
Official Communication issued in corresponding Japanese Patent Application No. 2011-032312, dated Aug. 2, 2011.
Official Communication issued in corresponding Japanese Patent Application No. 2011-032311, dated Aug. 23, 2011.
Kato et al.: "Wireless IC Device Component and Wireless IC Device"; U.S. Appl. No. 13/241,823, filed Sep. 23, 2011.
Kato et al.: "Antenna Device and Method of Setting Resonant Frequency of Antenna Device"; U.S. Appl. No. 13/272,365, filed Oct. 13, 2011.
Official Communication issued in International Patent Application No. PCT/JP2010/056812, dated Jul. 13, 2010.
Dokai et al.: "Optical Disc"; U.S. Appl. No. 13/295,153, filed Nov. 14, 2011.
Official Communication issued in International Patent Application No. PCT/JP2010/057668, dated Aug. 17, 2010.
Osamura et al.: "Radio Frequency IC Device and Method of Manufacturing the Same"; U.S. Appl. No. 13/308,575, filed Dec. 1, 2011.
Official Communication issued in International Patent Application No. PCT/JP2010/069417, dated Dec. 7, 2010.
Kato: "Wireless IC Device and Coupling Method for Power Feeding Circuit and Radiation Plate"; U.S. Appl. No. 13/325,273, filed Dec. 14, 2011.
Official Communication issued in International Patent Application No. PCT/JP2010/053496, dated Jun. 1, 2010.
Ikemoto: "Wireless IC Tag, Reader-Writer, and Information Processing System"; U.S. Appl. No. 13/329,354, filed Dec. 19, 2011.
Kato et al.: "Antenna and Antenna Module"; U.S. Appl. No. 13/334,462, filed Dec. 22, 2011.
Official Communication issued in International Patent Application No. PCT/JP2010/069418, dated Feb. 8, 2011.
Official Communication issued in International Patent Application No. PCT/JP2010/063082, dated Nov. 16, 2010.
Ikemoto: "Communication Terminal and Information Processing System"; U.S. Appl. No. 13/412,772, filed Mar. 6, 2012.
"Antenna Engineering Handbook", The Institute of Electronics and Communication Engineers, Mar. 5, 1999, pp. 20-21.
Official Communication issued in International Patent Application No. PCT/JP2010/066714, dated Dec. 14, 2010.
Nomura et al.: "Antenna and Wireless IC Device"; U.S. Appl. No. 13/419,454, filed Mar. 14, 2012.
Official Communication issued in International Patent Application No. PCT/JP2010/070607, dated Feb. 15, 2011.
Ito: "Wireless IC Device and Method of Detecting Environmental State Using the Device"; U.S. Appl. No. 13/421,889, filed Mar. 16, 2012.
Official Communication issued in International Patent Application No. PCT/JP2011/053654, dated Mar. 29, 2011.
Kato et al.: "Antenna Device and Mobile Communication Terminal"; U.S. Appl. No. 13/425,505, filed Mar. 21, 2012.

Official Communication issued in International Patent Application No. PCT/JP2010/069416, dated Feb. 8, 2011.
Kato et al.: "Wireless Communication Device and Metal Article"; U.S. Appl. No. 13/429,465, filed Mar. 26, 2012.
Official Communication issued in International Patent Application No. PCT/JP2011/055344, dated Jun. 14, 2011.
Kubo et al.: "Antenna and Mobile Terminal"; U.S. Appl. No. 13/452,972, filed Apr. 23, 2012.
Ikemoto: "RFID System"; U.S. Appl. No. 13/457,525, filed Apr. 27, 2012.
Ikemoto et al.: "Wireless IC Device and Electronic Apparatus"; U.S. Appl. No. 13/468,058, filed May 10, 2012.
Official Communication issued in International Patent Application No. PCT/JP2012/072849, dated Nov. 20, 2012.
Kimura et al.: "Wireless Communication Device"; U.S. Appl. No. 14/082,435, filed Nov. 18, 2013.
Kato: "Antenna Device and Wireless Device"; U.S. Appl. No. 14/085,830, filed Nov. 21, 2013.
Kato et al.: "Wireless IC Device Component and Wireless IC Device"; U.S. Appl. No. 14/151,852, filed Jan. 10, 2014.
Kato: "Wireless IC Device and Electromagnetic Coupling Module"; U.S. Appl. No. 14/160,597, filed Jan. 22, 2014.
Kato et al.: "Wireless IC Device"; U.S. Appl. No. 14/162,806, filed Jan. 24, 2014.
Kato et al.: "Antenna Device and Wireless Communication Device"; U.S. Appl. No. 14/171,004, filed Feb. 3, 2014.
Kato et al.: "Antenna and Wireless IC Device"; U.S. Appl. No. 14/182,339, filed Feb. 18, 2014.
Kimura et al., "Wireless Communication Device", U.S. Appl. No. 14/187,364, filed Feb. 24, 2014.
Official Communication issued in International Patent Application No. PCT/JP2012/050557, dated Apr. 10, 2012.
Kimura et al.: "Wireless Communication Device"; U.S. Appl. No. 13/789,761, filed Mar. 8, 2013.
Dokai et al.: "RFID Chip Package and RFID Tag"; U.S. Appl. No. 13/792,650, filed Mar. 11, 2013.
Kato et al.: "Wireless IC Device Component and Wireless IC Device"; U.S. Appl. No. 13/794,929, filed Mar. 12, 2013.
Kato et al.: "Wireless IC Device and Component for Wireless IC Device"; U.S. Appl. No. 13/848,748, filed Mar. 22, 2013.
Official Communication issued in International Patent Application No. PCT/JP2012/080493, dated Dec. 25, 2012.
Mukai et al.: "Inspection Method and Inspection Device for RFID Tag"; U.S. Appl. No. 13/933,184, filed Jul. 2, 2013.
Kato et al.: "Antenna Device and Method of Setting Resonant Frequency of Antenna Device"; U.S. Appl. No. 13/941,760, filed Jul. 15, 2013.
Kato et al.: "Antenna Device and Method of Setting Resonant Frequency of Antenna Device"; U.S. Appl. No. 13/943,973, filed Jul. 17, 2013.
Official Communication issued in International Patent Application No. PCT/JP2012/080700, dated Jan. 15, 2013.
Mukai et al.: "Wireless Integrated Circuit Dvice and Method of Manufacturing the Same"; U.S. Appl. No. 13/961,995, filed Aug. 8, 2013.
Kato et al.: "Radio IC Device"; U.S. Appl. No. 13/964,234, filed Aug. 12, 2013.
Official Communication issued in International Patent Application No. PCT/JP2012/067779, dated Aug. 28, 2012.
Official Communication issued in International Patent Application No. PCT/JP2013/051254, dated Apr. 2, 2013.
Dokai: "Wireless Communication Device"; U.S. Appl. No. 13/970,633, filed Aug. 20, 2013.
Official Communication issued in International Patent Application No. PCT/JP2012/059350, dated Jul. 3, 2012.
Dokai: "Wireless IC Device"; U.S. Appl. No. 14/011,823, filed Aug. 28, 2013.
Official Communication issued in International Patent Application No. PCT/JP2012/055505, dated Jun. 5, 2012.
Kato: "Radio IC Device and Radio Communication Terminal"; U.S. Appl. No. 14/017,406, filed Sep. 4, 2013.
Official Communication issued in International Patent Application No. PCT/JP2012/067454, dated Aug. 7, 2012.

(56) References Cited

OTHER PUBLICATIONS

Kato: "Antenna Device and Communication Terminal Apparatus"; U.S. Appl. No. 14/019,573, filed Sep. 6, 2013.
Official Communication issued in International Patent Application No. PCT/JP2012/067537, dated Oct. 9, 2012.
Kato: "Radio Communication Device"; U.S. Appl. No. 14/027,384, filed Sep. 16, 2013.
Kato: "Antenna Device, RFID Tag, and Communication Terminal Apparatus"; U.S. Appl. No. 14/031,270, filed Sep. 19, 2013.
Kato et al.: "Wireless IC Device"; U.S. Appl. No. 14/054,865, filed Oct. 16, 2013.
Official Communication issued in International Patent Application No. PCT/JP2012/062259, dated Jun. 12, 2012.
Dokai et al.: "Radio IC Device"; U.S. Appl. No. 14/078,596, filed Nov. 13, 2013.
Official Communication issued in International Patent Application No. PCT/JP2010/066291, dated Dec. 28, 2010.
Ikemoto: "Communication Terminal and Information Processing System"; U.S. Appl. No. 13/432,002, filed Mar. 28, 2012.
Official Communication issued in International Patent Application No. PCT/JP2010/070767, dated Feb. 22, 2011.
Ieki et al.: "Transceiver and Radio Frequency Identification Tag Reader"; U.S. Appl. No. 13/437,978, filed Apr. 3, 2012.
Official Communication issued in International Patent Application No. PCT/JP2011/065431, dated Oct. 18, 2011.
Kato et al.: "Wireless IC Device"; U.S. Appl. No. 13/470,486, filed May 14, 2012.
Kato: "Wireless IC Device"; U.S. Appl. No. 12/789,610, filed May 28, 2010.
Kato: "Antenna and RFID Device"; U.S. Appl. No. 13/472,520, filed May 16, 2012.
Kato et al.: "Wireless IC Device and Component for Wireless IC Device"; U.S. Appl. No. 13/540,694, filed Jul. 3, 2012.
Dokai et al.: "Wireless IC Device and Component for Wireless IC Device"; U.S. Appl. No. 13/567,108, filed Aug. 6, 2012.
Dokai et al.: "Wireless IC Device and Component for Wireless IC Device"; U.S. Appl. No. 13/567,109, filed Aug. 6, 2012.
Official Communication issued in International Patent Application No. PCT/JP2011/052594, dated May 17, 2011.
Kato et al.: "Wireless IC Device"; U.S. Appl. No. 13/585,866, filed Aug. 15, 2012.
Kato et al. "Radio Communication Device and Radio Communication Terminal"; U.S. Appl. No. 13/600,256, filed Aug. 31, 2012.
Murayama et al.: "Wireless Communication Module and Wireless Communication Device"; U.S. Appl. No. 13/598,872, filed Aug. 30, 2012.
Official Communication issued in International Patent Application No. PCT/JP2011/069689, dated Oct. 4, 2011.
Official Communication issued in corresponding Japanese Patent Application No. 2011-552116, dated Apr. 17, 2012.
Tsubaki et al.: "RFID Module and RFID Device"; U.S. Appl. No. 13/603,627, filed Sep. 5, 2012.
Kato et al.: "Antenna Device and Method of Setting Resonant Frequency of Antenna Device"; U.S. Appl. No. 13/604,807, filed Sep. 6, 2012.
Kato et al.: "Antenna Device and Method of Setting Resonant Frequency of Antenna Device"; U.S. Appl. No. 13/604,801, filed Sep. 6, 2012.
Official Communication issued in International Patent Application No. PCT/JP2011/053656, dated May 17, 2011.

* cited by examiner

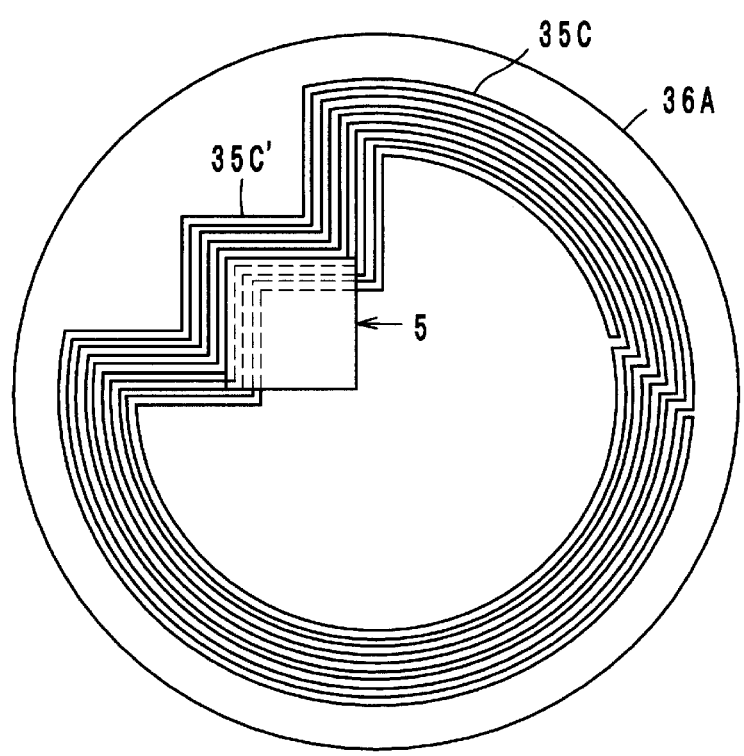

WIRELESS COMMUNICATION MODULE AND WIRELESS COMMUNICATION DEVICE

BACKGROUND OF THE INVENTION

1. Field of the Invention

The present invention relates to wireless communication modules and wireless communication devices, and more particularly, to a wireless communication module and a wireless communication device preferably for use in an RFID (Radio Frequency Identification) system, for example.

2. Description of the Related Art

In recent years, an RFID system has been used as an article information management system, which allows a reader/writer that generates an induction field and an RFID tag (also referred to as a wireless communication device) attached to an article to communicate with each other using a contactless system utilizing an electromagnetic field and to transmit certain information. The RFID tag includes a wireless IC that stores certain information and processes certain wireless signals and an antenna that sends and receives RF signals.

Japanese Unexamined Patent Application Publication No. 2007-102348 describes a wireless IC tag that includes an antenna coil having a multilayer structure. The wireless IC tag includes a multilayer coil provided on the surface and inner layers of a multilayer substrate formed by stacking a plurality of insulated substrates, and a wireless IC chip mounted on the surface of the multilayer substrate. Because the multilayer coil provided on the multilayer substrate functions as a radiation element, the wireless IC tag can be miniaturized to about a 5-mm square, although a not-so-long communication distance can be expected.

However, because the insulated substrates of the wireless IC tag are glass epoxy substrates and are very hard, when the insulated substrates are attached to a flexible base film, the attached portion loses the flexibility of the base film. Further, when the base film warps or bends, the insulated substrates may become detached from the base film. Also, since the wireless IC chip is mounted on a surface of planar insulated substrates, the overall height of the wireless IC tag becomes large, which prevents a reduction in the height of the wireless IC tag.

SUMMARY OF THE INVENTION

To overcome the problems described above, preferred embodiments of the present invention provide a wireless communication module and a wireless communication device that are less likely to be detached even when attached to a flexible base substrate and that have a reduced height.

A wireless communication module according to a first preferred embodiment of the present invention preferably includes a flexible multilayer substrate including a plurality of flexible base materials that are, the flexible multilayer substrate including a cavity, a wireless IC chip disposed in the cavity, a sealant that fills the cavity so as to cover the wireless IC chip, the sealant being harder than the flexible base materials, and a loop-shaped electrode including a coil pattern provided on or in the flexible multilayer substrate, the loop-shaped electrode being coupled to the wireless IC chip.

A wireless communication device according to a second preferred embodiment of the present invention includes the above described wireless communication module.

With regard to the wireless communication module, because the wireless IC chip is arranged in the cavity provided in the flexible multilayer substrate including the stacked flexible base materials and the cavity is filled with the sealant, which is harder than the flexible base materials, so as to cover the wireless IC chip, the wireless IC chip is protected by the sealant. Therefore, even when an external force is applied to the flexible multilayer substrate and the multilayer substrate warps or bends, stress is less likely to be applied to the wireless IC chip. Also, because the multilayer substrate is flexible itself, when the multilayer substrate is attached to a flexible base substrate, the multilayer substrate warps or bends in accordance with the base substrate. Thus, the possibility of the multilayer substrate being detached from the base substrate is very low. Further, because the wireless IC chip is accommodated in the cavity of the flexible multilayer substrate, the height of the wireless communication module is reduced.

According to various preferred embodiments of the present invention, even when attached to a flexible base substrate, the possibility of the wireless IC chip being detached is very low, the height wireless communication module is significantly reduced.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1A is a sectional diagram, and FIG. 1B is an explanatory diagram of a case in which an external force is applied to a multilayer substrate.

FIG. 3A is a perspective view, FIG. 3B is a sectional view, and FIG. 3C is a schematic explanatory diagram of a case in which an external force is applied to a base substrate FIG. 4A is a front view, and FIG. 4B is a back view.

FIG. 6A is a sectional view, and FIG. 6B is a plan view.

FIG. 7A is a sectional view, and FIG. 7B is a plan view.

FIG. 9A is a perspective view, FIG. 9B is a sectional view, and FIG. 9C is a plan view of a main portion.

FIG. 10A is a sectional view, and FIG. 10B is a sectional view showing a wireless communication device with the wireless communication module.

FIG. 12A is a front view, and FIG. 12B is a back view.

FIG. 15 is a front view showing a fourth example of an antenna pattern according to a preferred embodiment of the present invention.

DETAILED DESCRIPTION OF THE PREFERRED EMBODIMENTS

Figure 1A:
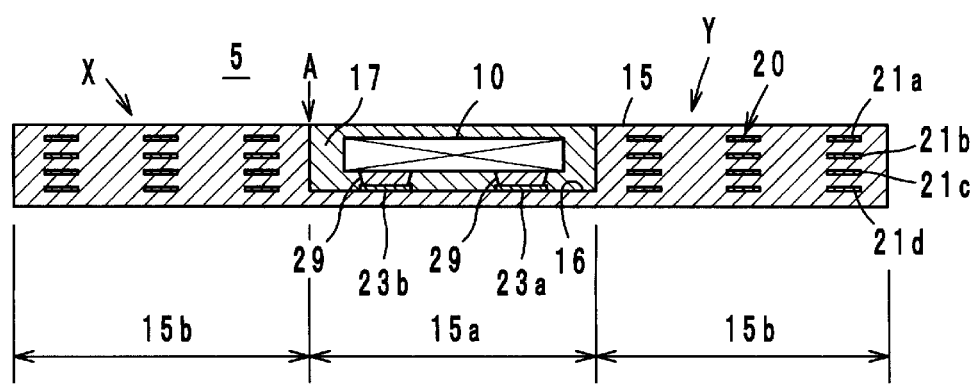
FIGS. 1A and 1B show a wireless communication module according to a first preferred embodiment of the present invention.

Hereinafter, a wireless communication module and a wireless communication device according to preferred embodiments of the present invention will be described with reference to the attached drawings. In the drawings, common components and elements are denoted by the same reference numerals, and redundant descriptions are omitted.
First Preferred Embodiment As shown in FIG. 1A, a wireless communication module 5 according to a first preferred embodiment of the present invention is preferably used in the 13.56-MHz band, for example. The wireless communication module 5 includes a wireless IC chip 10 that processes wireless signals, and a power feeding circuit substrate 15 that includes a loop-shaped electrode 20 that is electrically connected to the wireless IC chip 10 and that includes winding coil patterns 21a to 21d having a certain width W1 (see FIG. 2). The wireless IC chip 10 includes a clock circuit, a logic circuit, and a memory circuit, and necessary information is memorized in the wireless IC chip 10. With regard to the wireless IC chip 10, an input terminal electrode and an output terminal electrode provided on the back surface of the wireless IC chip 10 are electrically connected to two ends of the loop-shaped electrode 20.

The power feeding circuit substrate 15 is preferably a flexible multilayer substrate, for example, and a central portion thereof includes a cavity 16. The wireless IC chip 10 is disposed in the cavity 16, and the cavity 16 is filled with a sealant 17. The loop-shaped electrode 20, which includes the plurality of coil patterns 21a to 21d that are stacked in multiple layers, is included in the power feeding circuit substrate 15. Specifically, as shown in FIG. 2, the power feeding circuit substrate 15 is formed by stacking and crimping a plurality of base layers 18a to 18e.

The base layers 18a to 18e are preferably made of a flexible material, such as a thermoplastic resin including, for example, a liquid crystal polymer. In this manner, the substrate 15, which includes the stacked base layers made of a thermoplastic resin, has elasticity while being flexible. The sealant 17 is preferably made of a resin material that is harder than the flexible base layers 18a to 18e, such as a thermosetting resin including, for example, an epoxy polymer.

Figure 2:
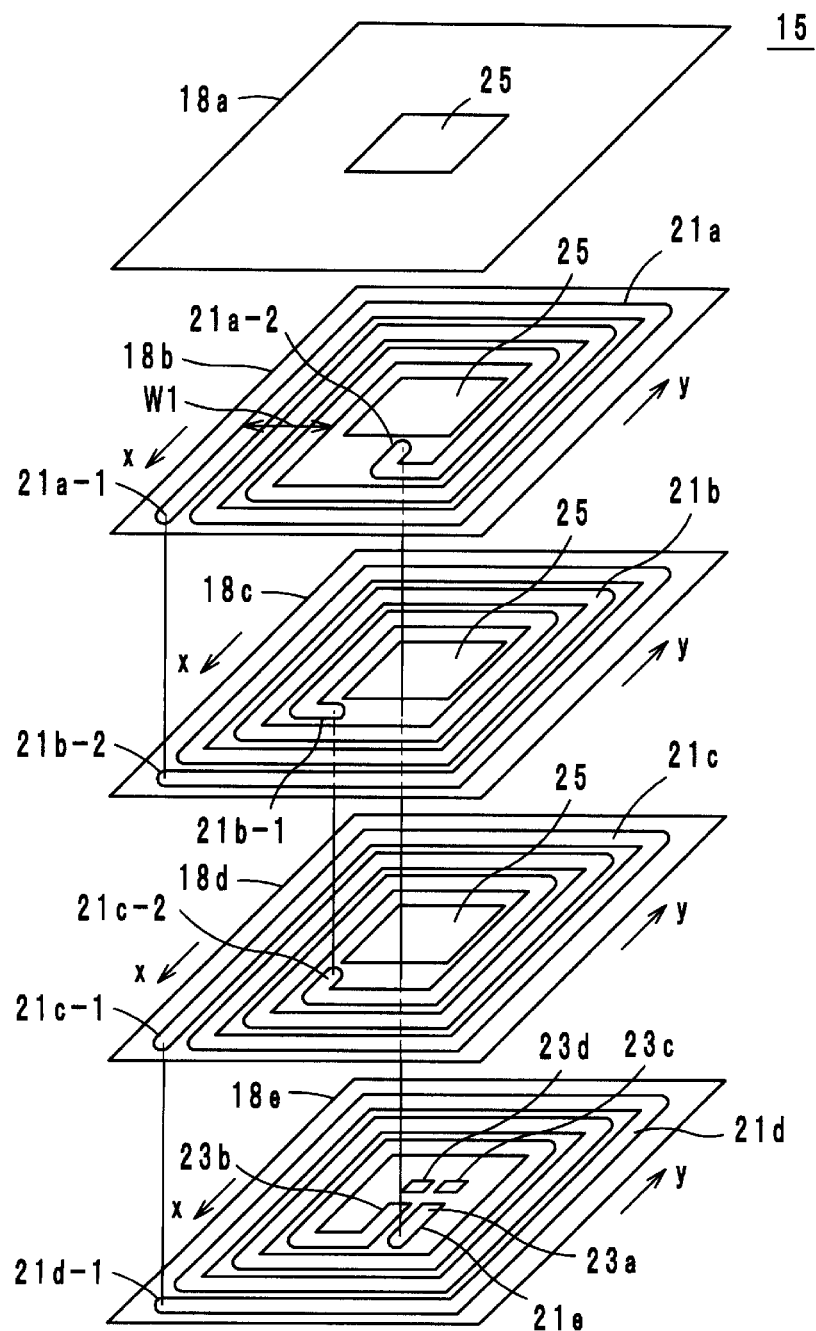
FIG. 2 is a perspective view showing a multilayer structure of the multilayer substrate of the wireless communication module according to the first preferred embodiment of the present invention.

In FIG. 2, an opening 25 is provided at a central portion of the top base layer 18a. Openings 25 are provided at the central portions of the second to fourth base layers 18b to 18d, and the coil patterns 21a to 21c are provided. The coil pattern 21d including a land 23b at one end, the pattern 21e including a land 23a at one end, and lands 23c and 23d are provided on the bottom base layer 18e. These coil patterns and lands may preferably be made of a metal material including Ag or Cu as a main ingredient, for example, and may preferably be formed by patterning a metal film using photolithography or etching, or by screen-printing a conductive paste, for example.

By stacking the base layers 18a to 18e, one end 21d-1 of the coil pattern 21d on the bottom layer is connected to one end 21c-1 of the coil pattern 21c on the fourth layer via an interlayer conductor, and another end 21c-2 of the coil pattern 21c is connected to one end 21b-1 of the coil pattern 21b on the third layer via an interlayer conductor. Another end 21b-2 of the coil pattern 21b is connected to one end 21a-1 of the coil pattern 21a on the second layer via an interlayer conductor. Another end 21a-2 of the coil pattern 21a is connected to the pattern 21e, which is provided on the bottom layer, via an interlayer conductor.

Figure 1B:
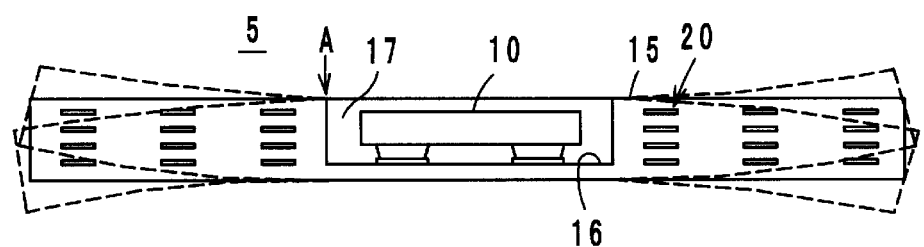

The openings 25 define the cavity 16. With regard to the wireless IC chip 10 accommodated in the cavity 16, the input terminal electrode is connected to the land 23b, and the output terminal electrode is connected to the land 23a, respectively, via conductive joints, such as soldering bumps 29, for example (see FIGS. 1A and 1B). A mounting terminal electrode provided on the back surface of the wireless IC chip 10 is connected to the lands 23c and 23d provided on the bottom layer.

By winding the coil patterns 21a to 21d as described above, the loop-shaped electrode 20, which preferably has, for example, a rectangular or substantially rectangular shape when seen in plan view, is provided. The width W1 at which the coil patterns 21a to 21d are wound is defined as the width from a pattern at the inner-circumferential side to a pattern at the outer-circumferential side. When electric current is supplied from the land 23a, the electric current flows through the coil patterns 21a to 21d in a first direction indicated by arrow x and in a second direction indicated by arrow y, which is the opposite direction from the first direction x. That is, the coil patterns 21a to 21d are wound so that electric current flows in the same direction in portions that are adjacent to one another in a stacking direction. When viewed in plan from a coil axis direction, a region that extends in the first direction x is referred to as a first region X, and a region that extends in the second direction y is referred to as a second region Y.

The wireless IC chip 10 is preferably made of a semiconductor substrate, such as silicon, for example, and may break due to warping or bending stress. With regard to the wireless communication module 5, because the wireless IC chip 10 is arranged in the cavity 16 provided in the flexible multilayer substrate (power feeding circuit substrate 15) including the stacked flexible base layers 18a to 18e, and the cavity 16 is filled with the sealant 17, which is harder than the flexible base layers 18a to 18e, so as to cover the wireless IC chip 10, the wireless IC chip 10 is protected by the sealant 17. Therefore, as indicated by dotted lines in FIG. 1B, even when an external force is applied to the power feeding circuit substrate 15 and the power feeding circuit substrates 15 warps or bends, stress occurs at an interface A between the cavity 16 and the sealant 17, not at the wireless IC chip 10. With regard to the substrate 15, a portion in which the sealant 17 is arranged is referred to as a rigid region 15a, and portions extending from the periphery of the rigid region 15a to edge portions thereof are referred to as flexible regions 15b.

Figure 19:
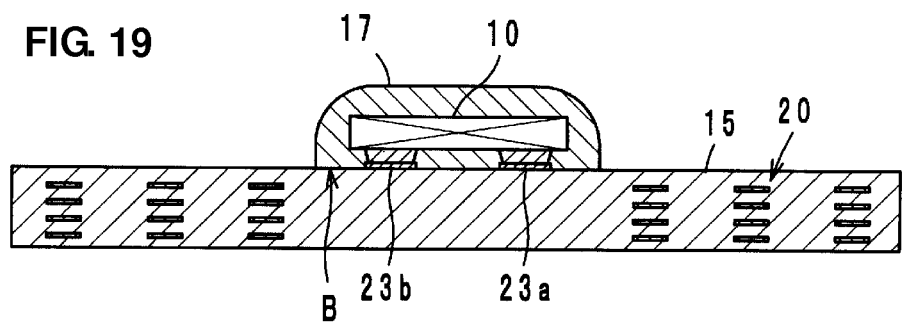
FIG. 19 is a sectional view showing a comparative example in which a wireless IC chip is externally mounted to the surface of a multilayer substrate.

As in a comparative example shown in FIG. 19, when the wireless IC chip 10 is mounted on the front surface of the flexible multilayer substrate 15 and is covered with the hard sealant 17, stress due to warping or bending of the multilayer substrate 15 occurs at an interface B between the multilayer substrate 15 and the sealant 17. When the stress is applied to the interface B and a crack or other damage occurs, the reliability of the joint between the wireless IC chip 10 and the lands 23a and 23b is reduced. In the present preferred embodiment, because stress does not occur at the interface B near the joint portion of the wireless IC chip 10, the reliability of the joint is greatly improved.

Also in the first preferred embodiment, because the wireless IC chip 10 is accommodated in the cavity 16 of the substrate 15, the height of the wireless communication module 5 is reduced. The depth of the cavity 16 is preferably greater than or equal to about half the thickness of the substrate 15, for example. In this manner, the sealant 17 occupies most of the inner circumferential portion of the loop-shaped electrode 20 (the rigidity of the rigid region 15a is increased), stress due to warping or bending of the flexible regions 15b is effective confined at lateral surfaces of the cavity 16, and the stress is thus not significantly applied or applied at all to the bottom surface of the cavity 16, that is, to a joint portion of the wireless IC chip 10 with the loop-shaped electrode 20.

Also in the first preferred embodiment, the sealant 17 preferably includes a magnetic filler, such as ferrite powder, for example. In this manner, radiation noise from the wireless IC chip 10 is reduced, and the inductance value of the coil patterns 21a to 21d is increased. As described above, the depth of the cavity 16 is preferably increased so as to increase the inductance value.

First Example of Wireless Communication Device

Next, a first example of a wireless communication device according to a preferred embodiment of the present invention including the above described wireless communication module 5 will be described.

Figure 3A:
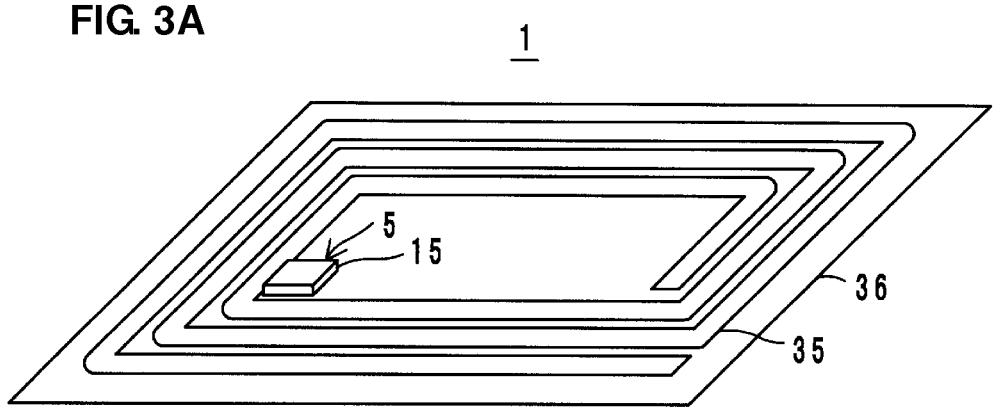
FIGS. 3A-3C show a first example of a preferred embodiment of a wireless communication device including the wireless communication module.
Figure 4A:
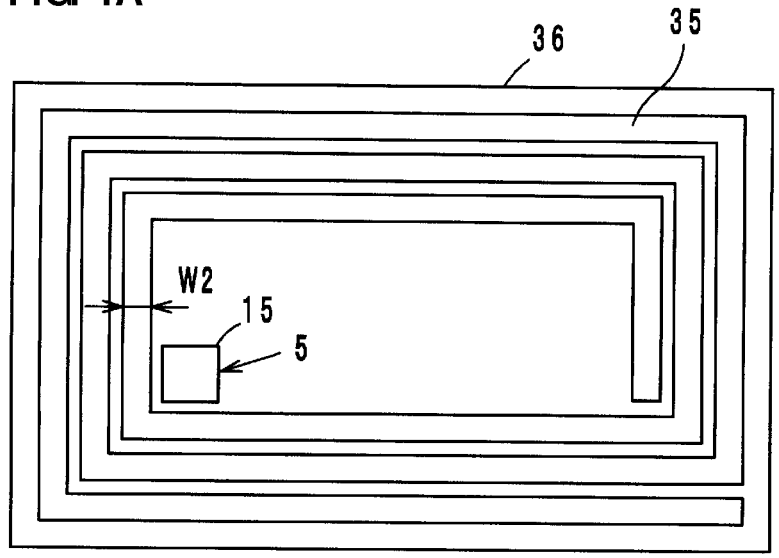
FIGS. 4A and 4B show antenna patterns of the wireless communication module shown in FIG. 3A.
Figure 4B:
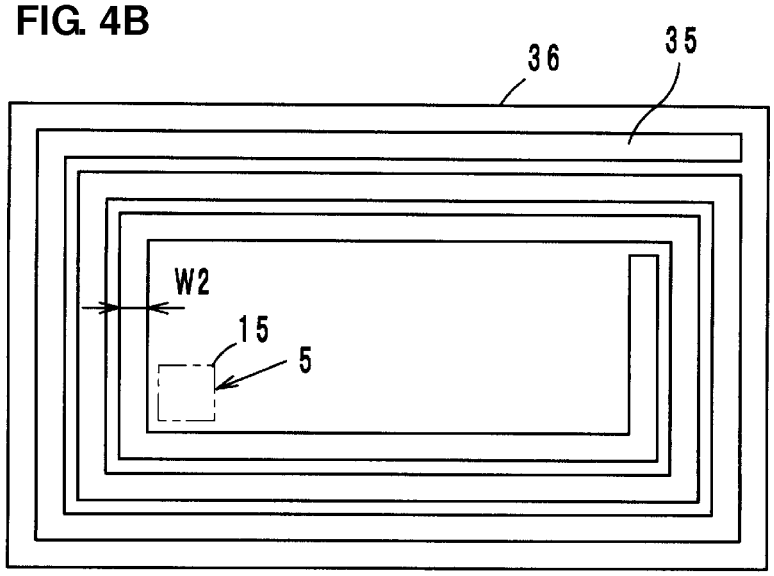

As shown in FIG. 3A, a wireless communication device 1 includes the wireless communication module 5, and an antenna pattern 35, which is magnetically coupled (may be electro-magnetically coupled; the same applies hereinafter) to the loop-shaped electrode 20. The antenna pattern 35 preferably has a coil shape including three winding turns, for example, on the front surface and the back surface of a flexible base substrate 36 preferably made of, for example, PET, and two ends thereof are formed to be open. FIG. 4A shows the antenna pattern 35 on the front surface side, and FIG. 4B shows the antenna pattern 35 on the back surface side that is shown from the front surface side. The antenna patterns 35 on the front and back surfaces are configured such that the antenna patterns 35 have the same or substantially the same line widths W2, overlap each other with a distance therebetween when viewed in plan, and are capacitively coupled to each other via the base substrate 36. Electric current flows in the same direction. The antenna patterns 35 are preferably made of a metal material including Ag or Cu as a main ingredient, for example, and are preferably formed by patterning a metal film using photolithography or etching, or by screen-printing a conductive paste, for example.

Figure 3B:
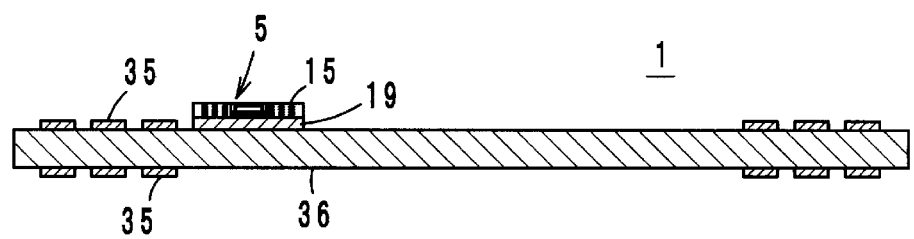

The wireless communication module 5 is arranged such that the power feeding circuit substrate 15 extends along an inner corner portion of the antenna pattern 35 on the front surface (see FIG. 4A) and is attached with an insulating adhesive 19 (see FIG. 3B).

In the wireless communication device 1, the loop-shaped electrode 20 is magnetically coupled to the antenna patterns 35. Thus, an RF signal radiated from a reader/writer of an RFID system and received at the antenna patterns 35 is supplied to the wireless IC chip 10 via the loop-shaped electrode 20, and the wireless IC chip 10 operates. At the same time, a response signal from the wireless IC chip 10 is communicated to the antenna patterns 35 via the loop-shaped electrode 20 and is radiated to the reader/writer.

With inductance components of the coil patterns 21a to 21d and capacitance components between these patterns, the loop-shaped electrode 20 defines a resonant circuit at a desired frequency. The loop-shaped electrode 20 also functions as an impedance matching circuit between the wireless IC chip 10 and the antenna patterns 35. The resonant frequency and the impedance can be adjusted by adjusting the electrical length or pattern width of the loop-shaped electrode 20.

Also, the power feeding circuit substrate 15 is preferably flexible itself and has elasticity. When the substrate 15 is attached to the flexible base substrate 36, the substrate 15 warps or bends in accordance with the base substrate 36 (see FIG. 3C), and the possibility of the substrate 15 becoming detached from the base substrate 36 due to excessive stress applied to the adhesive 19 is very low. Even when the power feeding circuit substrate 15 warps or bends in accordance with the base substrate 36, the built-in wireless IC chip 10 is protected.

Note that the wireless communication module 5 can independently communicate with the reader/writer without being combined with the above described antenna patterns 35, though the communication distance may be short. In this case, the loop-shaped electrode 20 functions as a radiation element.

Second Preferred Embodiment

Figure 5:
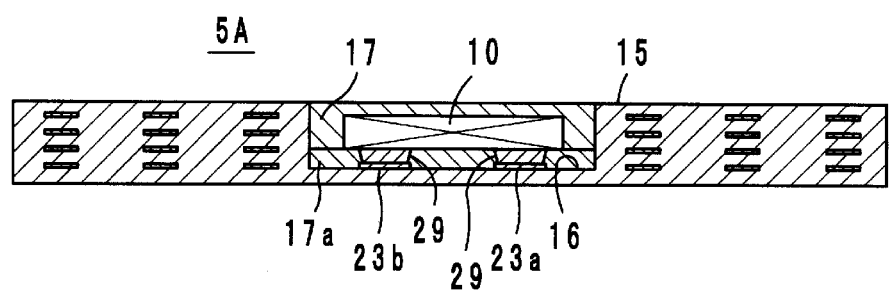
FIG. 5 is a sectional view showing a wireless communication module according to a second preferred embodiment of the present invention.

As shown in FIG. 5, a wireless communication module 5A according to a second preferred embodiment of the present invention is formed by disposing the wireless IC chip 10 in the cavity 16 of the power feeding circuit substrate 15, connecting the wireless IC chip 10 to the lands 23a and 23b, fixing the wireless IC chip 10 with a sealant 17a preferably made of an underfill resin, for example, and then sealing the cavity 16 with the sealant 17 preferably made of a harder resin, for example. For example, an epoxy resin can preferably be used as the sealant 17a made of an underfill resin. Stress that occurs between the substrate 15 and the sealant 17 is dispersed by setting the hardness of the sealant 17a to an intermediate level between that of the power feeding circuit substrate 15 and that of the sealant 17, which results in improved joint reliability.

Third and Fourth Preferred Embodiments

The coil patterns 21a to 21d defining the loop-shaped electrode 20 are made of a conductive material that is harder than the flexible base layers 18a to 18e, and the coil patterns 21a to 21d are wound a plurality of turns. The density of these coil patterns 21a to 21d may preferably increase continuously or step-wise from the outer circumference to the inner circumference, when viewed in plan from the coil axis direction. In this manner, the hardness of the flexible regions 15b of the power feeding circuit substrate 15 increases from the outer circumference to the inner circumference, so as to prevent stress due to warping or bending from concentrating in a lateral portion (interface A) of the sealant 17. That is, stress due to warping or bending is caused to be applied to the outside the power feeding circuit substrate 15, instead of the lateral portion (interface A) of the sealant 17. This more reliably protects the wireless IC chip 10 disposed in the cavity 16.

Figure 6A:
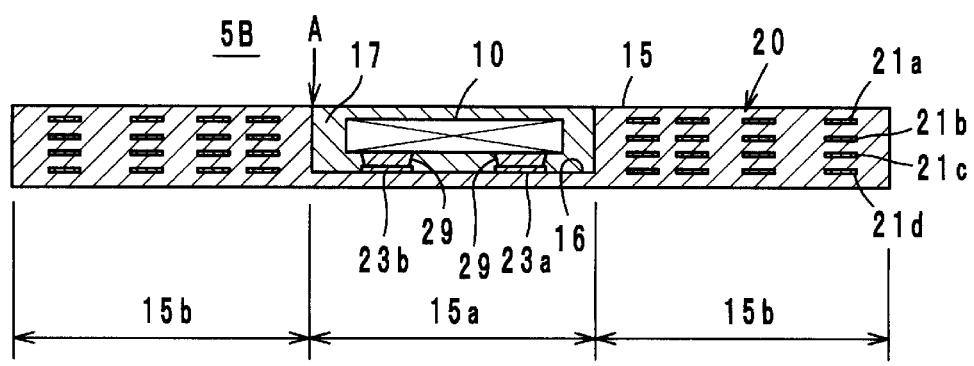
FIGS. 6A and 6B show a wireless communication module according to a third preferred embodiment of the present invention.
Figure 6B:
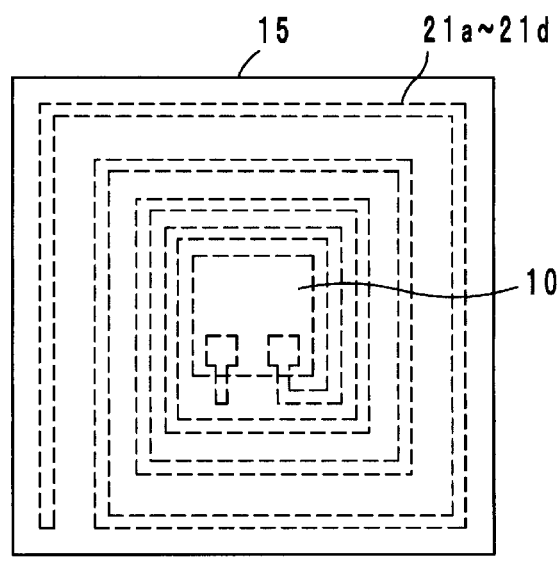

Specifically, in a wireless communication module 5B according to a third preferred embodiment of the present invention shown in FIGS. 6A and 6B, the coil patterns 21a to 21d are arranged so that the distance between adjacent patterns that have the same width gets narrower from the outer circumference to the inner circumstance.

Figure 7A:
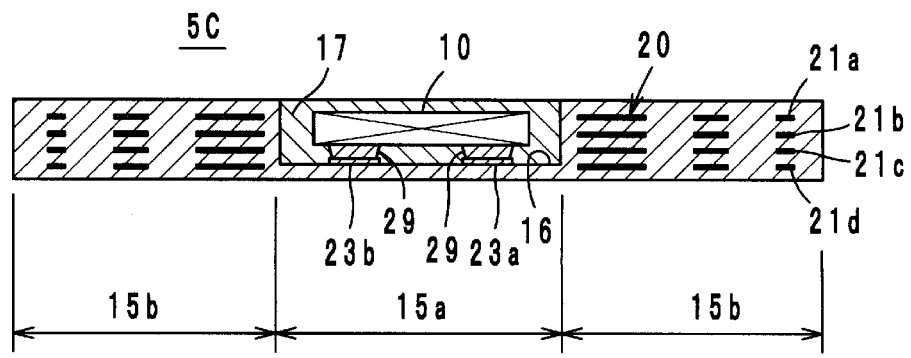
FIGS. 7A and 7B show a wireless communication module according to a fourth preferred embodiment of the present invention.
Figure 7B:
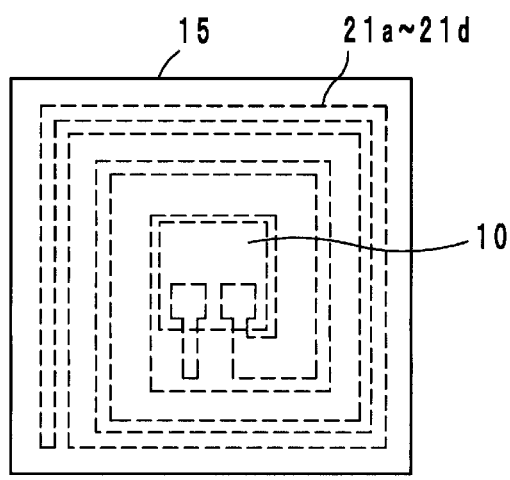

Also, in a wireless communication module 5C according to a fourth preferred embodiment of the present invention shown in FIGS. 7A and 7B, the coil patterns 21a to 21d are arranged so that the distance between adjacent patterns is constant or substantially constant and the line width gets wider from the outer circumference to the inner circumstance.

Fifth Preferred Embodiment

Figure 8:
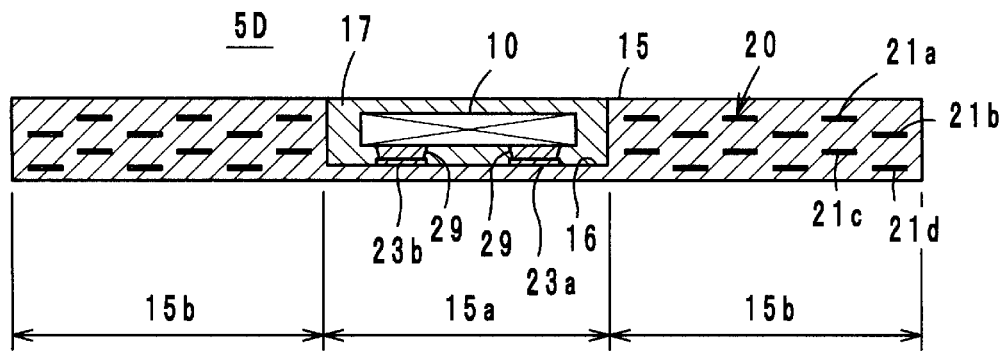
FIG. 8 is a sectional view showing a wireless communication module according to a fifth preferred embodiment of the present invention.

In a wireless communication module 5d according to a fifth preferred embodiment of the present invention shown in FIG. 8, the coil patterns 21a to 21d provided on adjacent layers are arranged so as not to overlap one another when viewed in plan. If coil patterns that are vertically adjacent to each other overlap when viewed in plan, the distance between the vertically adjacent coil patterns is reduced when the power feeding circuit substrate 15 warps or bends, resulting in fluctuations (increase) of the line capacity and of the resonant frequency of the LC resonant circuit defined by the loop-shaped electrode 20. However, according to the fifth preferred embodiment, fluctuations of the line capacity (eventually the resonant frequency) due to warping or bending of the substrate 15 are minimized or prevented because vertically adjacent coil patterns do not overlap each other when viewed in plan.

Second Example of Wireless Communication Device

Next, a second example of a wireless communication device according to a preferred embodiment including the wireless communication module 5 will be described.

Figure 9A:
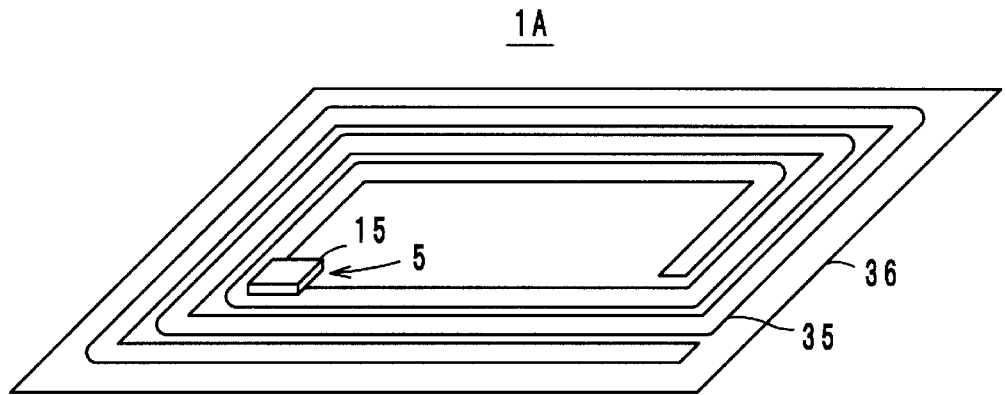
FIGS. 9A-9C show a second example of a wireless communication device with the wireless communication module according to a preferred embodiment of the present invention.

As shown in FIG. 9A, with regard to a wireless communication device 1A, the wireless communication module 5 is arranged so that the power feeding circuit substrate 15 faces an inner corner portion of the antenna pattern 35 on the front surface thereof. The remaining structure is the same or substantially the same as that of the wireless communication device 1 shown in FIGS. 3A-3C.

Figure 9B:
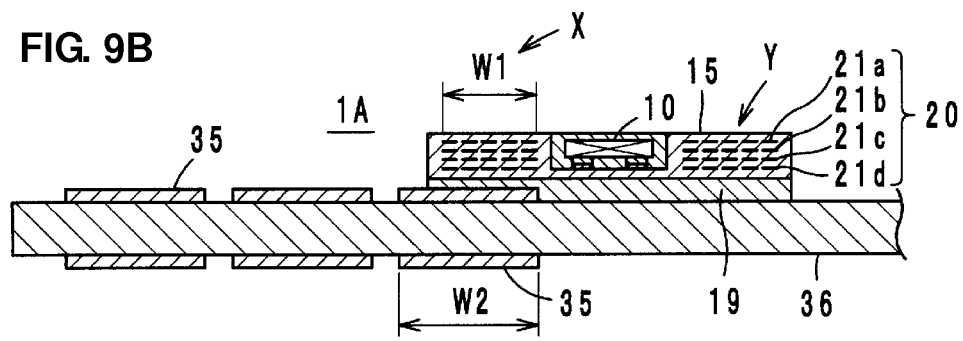
Figure 9C:
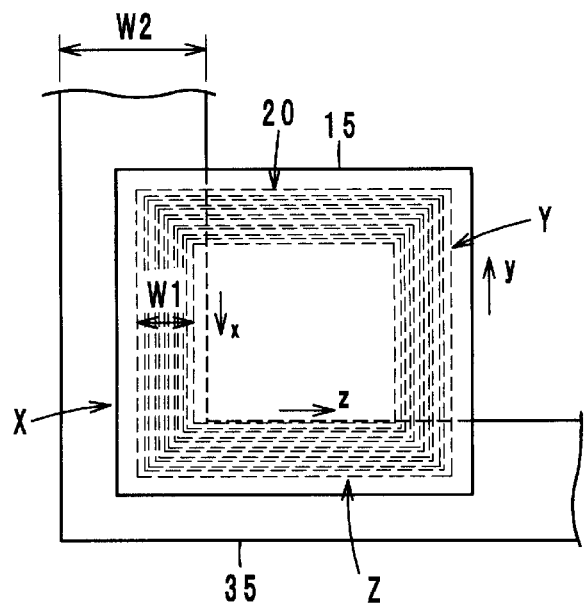

The vertical arrangement of the loop-shaped electrode 20 with respect to the antenna patterns 35 is as shown in FIG. 9B. The first region X is arranged to overlap the antenna pattern 35, and the second region Y is arranged not to overlap the antenna pattern 35. Also, the first direction x (line length direction of the coil patterns 21a to 21d) preferably coincides or substantially coincides with the line length direction of the antenna patterns 35.

With the wireless communication device 1A, the first region X of the loop-shaped electrode 20 is magnetically coupled to the antenna pattern 35. Therefore, an RF signal that is radiated from a reader/writer of an RFID system and received at the antenna pattern 35 is supplied to the wireless IC chip 10 via the loop-shaped electrode 20, and the wireless IC chip 10 operates. At the same time, a response signal from the wireless IC chip 10 is communicated to the antenna pattern 35 via the loop-shaped electrode 20 and is radiated to the reader/writer.

With the wireless communication device 1A, because the first region X which extends in the first direction x of the loop-shaped electrode 20 is arranged so as to overlap the antenna pattern 35 and is magnetically coupled to the antenna pattern 35, the magnetic coupling between the loop-shaped electrode 20 and the antenna pattern 35 is maintained in the overlapping portion even when another metal body approaches, and the coupling between the two is not deteriorated. In particular, when the loop-shaped electrode 20 at its full width W1 overlaps the antenna pattern 35 in the first region X, the value of a stray capacitance generated between the loop-shaped electrode 20 and the antenna pattern 35 does not fluctuate, so as to minimize or prevent fluctuations of the frequency characteristics.

Also, because the first direction x (line length direction of the coil patterns 21a to 21d) coincides or substantially coincides with the line length direction of the antenna patterns 35, when an RF signal is sent, electric current flowing through the coil patterns 21a to 21d is led to the antenna patterns 35 as an induced current in the line length direction thereof, and thus, RF power is efficiently transmitted. In the magnetically coupled portion, the line length directions of the coil patterns 21a to 21d and the antenna patterns 35 need not exactly coincide with each other; it is only necessary for the line length directions of the coil patterns 21a to 21d and the antenna patterns 35 to roughly coincide with each other. In other words, the line length directions of the two can be any directions as long as they are not perpendicular or substantially perpendicular to each other.

Also, because the power feeding circuit substrate is arranged to face the inner corner portion of the antenna pattern 35, a third region Z that extends in a third direction (see arrow z) that is perpendicular or substantially perpendicular to the first direction of the loop-shaped electrode 20 also overlaps the antenna pattern 35, and the third direction z and the line length direction of the antenna pattern 35 coincide or substantially coincide with each other. Accordingly, the loop-shaped electrode 20 and the antenna pattern 35 are magnetically coupled to each other in two regions, namely, the first region X and the third region Z, which results in a higher degree of coupling therebetween.

Sixth Preferred Embodiment

Figure 10A:
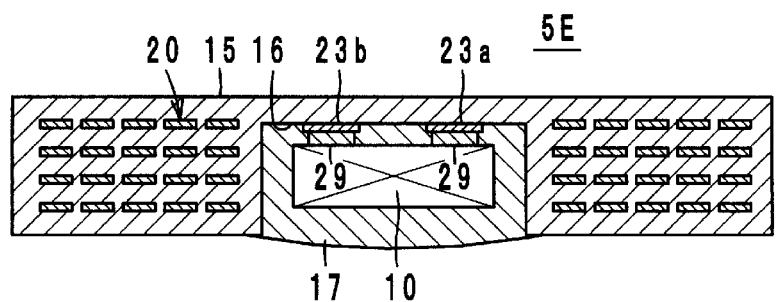
FIGS. 10A and 10B show a wireless communication module according to a sixth preferred embodiment of the present invention.
Figure 10B:
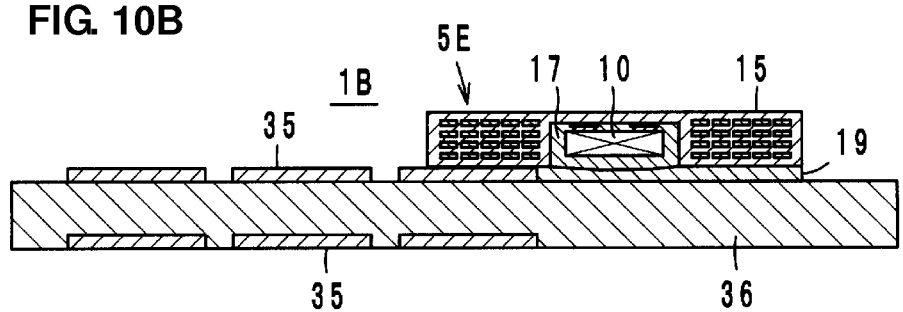

As shown in FIG. 10A, a wireless communication module 5E according to a sixth preferred embodiment of the present invention is formed by forming the cavity 16 in the power feeding circuit substrate 15 to open towards the back surface side of the substrate 15, accommodating the wireless IC chip 10 in the cavity 16, and filling the cavity 16 with the sealant 17. The remaining structure is preferably the same or substantially the same as that of the first preferred embodiment. Note that the number of turns of the loop-shaped electrode 20 is preferably increased. As shown in portion FIG. 10B, the wireless communication module 5E is attached to the base substrate 36 with the insulating adhesive 19 so that the opening portion of the cavity 16 faces the base substrate 36, thus providing the wireless communication device 1B.

The operational effects and advantages of the wireless communication module 5E and the wireless communication device 1B are substantially the same as those shown in FIGS. 1A, 1B, and 3A-3C. In particular, the wireless IC chip 10 is protected by the bottom surface (arranged as the top surface in FIG. 10A) of the cavity 16. Because the planarity of the bottom surface (arranged as the top surface in FIG. 10A) of the power feeding circuit substrate 15 is relatively high, vacuum suction of the wireless communication module 5E onto the base substrate 36 using a mounter has good suction performance. Further, as shown in FIG. 10A, because the sealant 17 slightly protrudes from the cavity 16, the protruding portion provides anchoring effects when mounted to the base substrate 36 (attached using the adhesive 19), and the power feeding circuit substrate 15 is securely connected to the base substrate 36. Anchoring effects are provided even when the sealant 17 has a concave shape, which is opposite from the shape shown in FIG. 10A.

Third Example of Wireless Communication Device

Next, a third example of a wireless communication device according to a preferred embodiment of the present invention including the wireless communication module 5 will be described.

Figure 11:
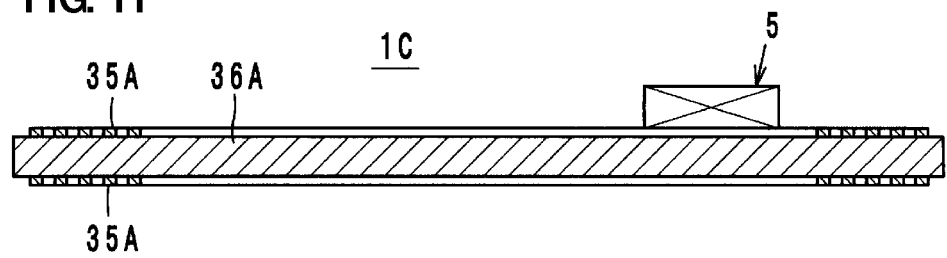
FIG. 11 is a sectional view showing a third example of a wireless communication device according to a preferred embodiment of the present invention.

As shown in FIG. 11, a wireless communication device 1C includes the wireless communication module 5 mounted on a circular or substantially circular and flexible base substrate 36A, and antenna patterns 35A are provided on the front and back surfaces of the base substrate 36A. The antenna pattern 35A on the back surface shown in FIG. 12B is illustrated when viewed perspectively from the front surface side. The antenna patterns 35A are circularly or substantially circularly wound. The antenna patterns 35A overlap each other substantially over the entire length thereof, when viewed in plan, and are capacitively coupled to each other. The antenna patterns 35A define an equivalent circuit shown in FIG. 13. An inductor L1 defined by the antenna pattern 35A on the front surface side and an inductor L2 defined by the antenna pattern 35A on the back surface side are coupled to each other by a capacitance C1 between the innermost patterns and a capacitance C2 between the outermost patterns. A capacitance C3 is also generated between the front and back patterns.

Figure 3C:
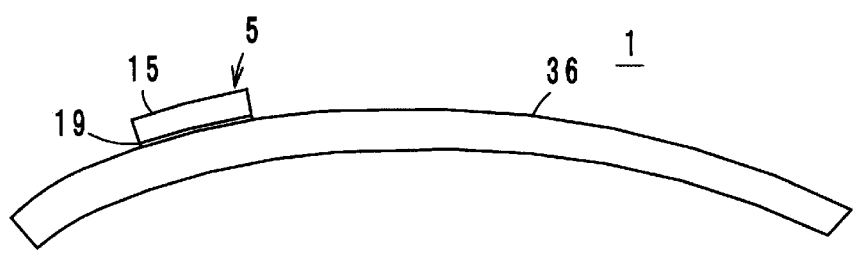

The operation of the antenna patterns 35A that are capacitively coupled to each other is the same or substantially the same as that of the antenna patterns 35 shown in FIGS. 3A-3C, and electric current flows in the same direction. The coil-shaped electrode 20 of the wireless communication module 5, which is arranged on the front surface of the base substrate 36A so as to overlap the antenna pattern 35A, is magnetically coupled to the antenna pattern 35A. Therefore, an antenna of a reader/writer can communicate with the wireless communication module 5 via the antenna pattern 35A. The basic operational effects and advantages of the wireless communication device 1C are the same or substantially the same as those described with respect to the wireless communication device 1.

With regard to the wireless communication device 1C, two ends of the antenna patterns 35A arranged on the front and back of the base substrate 36A may be DC-coupled to each other, respectively, using crimping (pouching), or one ends of the antenna patterns 35A may similarly be DC-coupled to each other. In short, it is only necessary for the ends of the antenna patterns 35A to be coupled to each other so that the directions of electric current flowing through the antenna patterns 35A on the front and back are the same.

Third Example of Antenna Pattern

Figure 13:
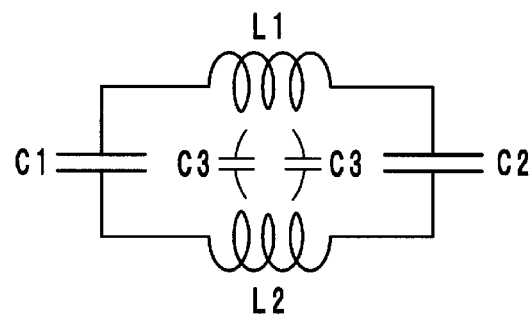
FIG. 13 is an equivalent circuit diagram of the antenna patterns according to the second example of a preferred embodiment of the present invention.
Figure 14:
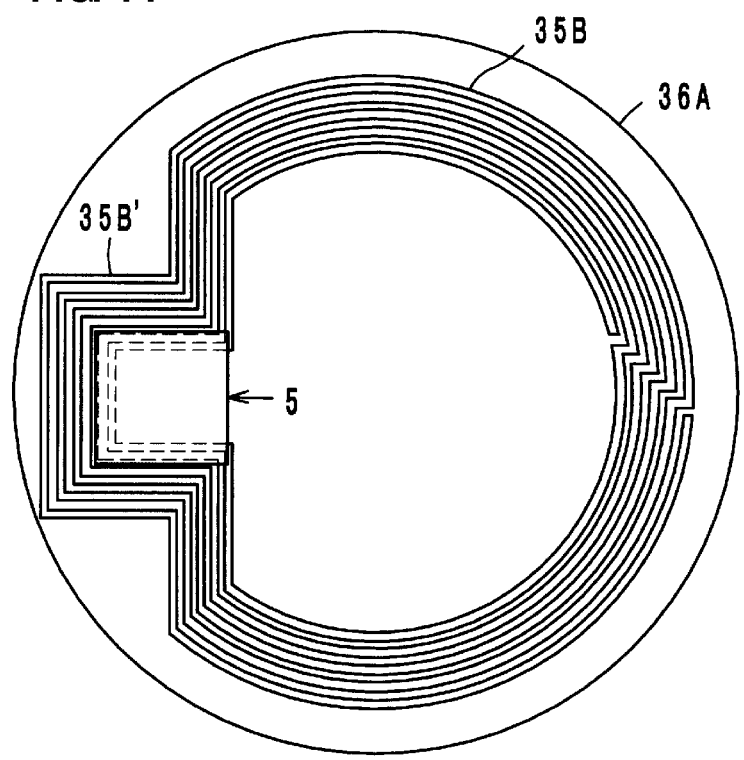
FIG. 14 is a front view showing a third example of an antenna pattern according to a preferred embodiment of the present invention.

FIG. 14 shows an antenna pattern 35B according to a third example of a preferred embodiment of the present invention. The antenna pattern 35B preferably has a substantially circular shape with a rectangular portion 35B'. The antenna pattern 35B is provided on the front and back surfaces of the base substrate 36A, and the antenna pattern on the back surface side is arranged to overlap the antenna pattern 35B on the front surface side when viewed in plan. The antenna patterns 35B on the front and back surfaces are capacitively coupled to each other, and an equivalent circuit thereof is preferably the same or substantially the same as that in FIG. 13.

The wireless communication module 5 is disposed on the front surface side of the base substrate 36A and is arranged along the inner circumstantial portion of the rectangular portion 35B'. The coil-shaped electrode 20 included in the wireless communication module 5 is magnetically coupled to the antenna pattern 35B so as to define the wireless communication device. The operational effects and advantages of the antenna pattern 35B are the same or substantially the same as those described with respect to the antenna patterns 35A. In particular, the antenna pattern 35B is preferably coupled at three sides to the coil-shaped electrode 20, resulting in an increased amount of coupling between the antenna pattern 35B and the coil-shaped electrode 20.

Fourth Example of Antenna Pattern

FIG. 15 shows an antenna pattern 35C according to a fourth example of a preferred embodiment of the present invention. The antenna pattern 35C preferably has a substantially circular shape including a stepped portion 35C'. The antenna pattern 35C is provided on the front and back surfaces of the base substrate 36A, and the antenna pattern on the back surface side is arranged to overlap the antenna pattern 35C on the front surface side when viewed in plan. The antenna patterns 35C on the front and back surfaces are capacitively coupled to each other, and an equivalent circuit thereof is the same or substantially the same as that in FIG. 13.

The wireless communication module 5 is disposed on the front surface side of the base substrate 36A and is arranged along the inner circumstantial portion of the stepped portion 35C'. The coil-shaped electrode 20 is magnetically coupled to the antenna pattern 35C, thus constituting the wireless communication device. The operational effects of the antenna patterns 35C are the same as those described with regard to the antenna patterns 35A. In particular, the antenna pattern 35C is coupled at its two sides to the coil-shaped electrode 20, resulting in an increased amount of coupling between the antenna pattern 35C and the coil-shaped electrode 20.

Fifth Example of Antenna Pattern

Figure 16A:
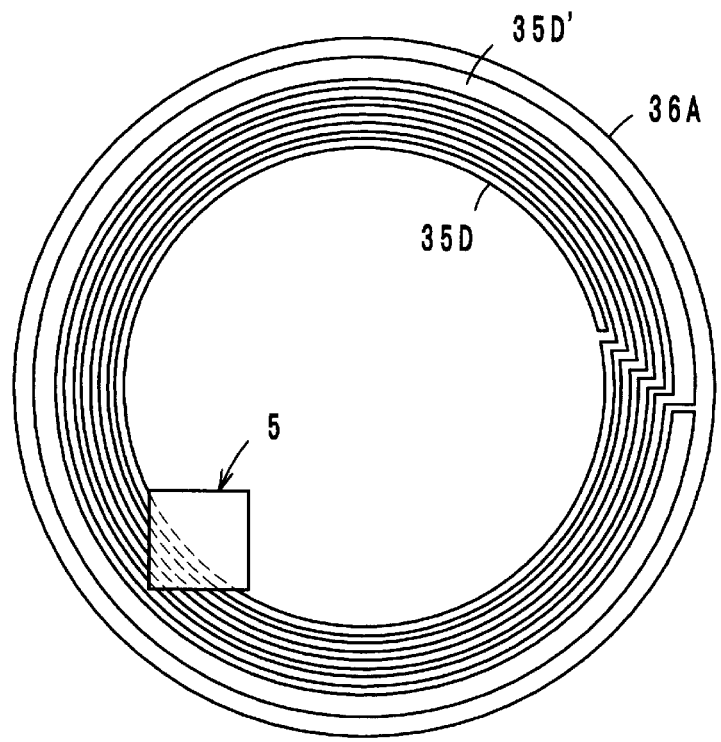
FIGS. 16A and 16B are front views showing a fifth example of an antenna pattern according to a preferred embodiment of the present invention.
Figure 16B:
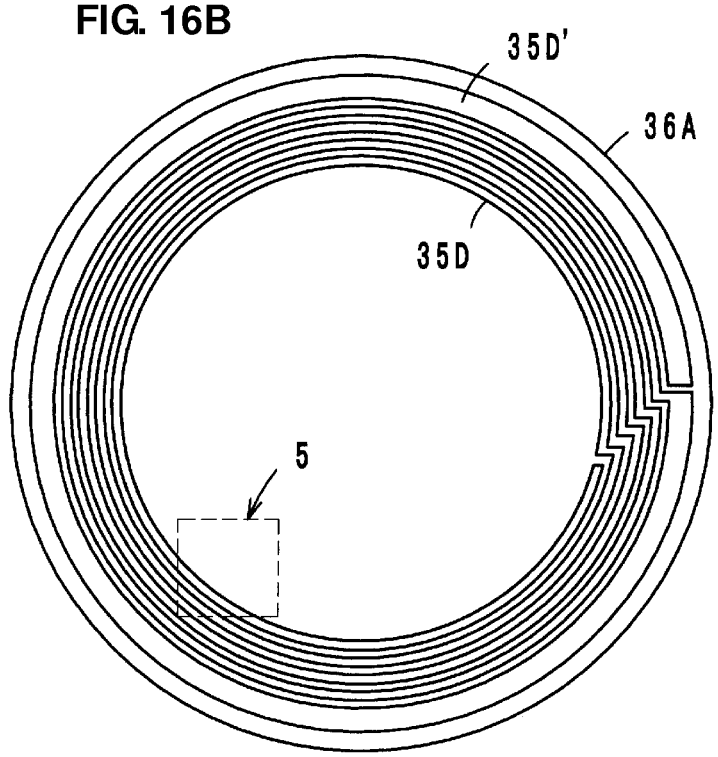

FIGS. 16A and 16B show antenna patterns 35D according to a fifth example of a preferred embodiment of the present invention. The antenna patterns 35D are preferably arranged in the same or substantially the same shape as the antenna patterns 35A shown in FIGS. 12A and 12B. Outermost turn portions 35D' are wider than those of the other portions. The remaining structure and operational effects and advantages are substantially the same as those described with respect to the antenna pattern 35A. In addition, because the coupling capacitance value is increased in the outermost turn portions 35D', the resonant frequency of the antenna patterns 35D can be decreased. In other words, a magnetic flux passing region can be enlarged without reducing the aperture size. Thus, the resonant frequency can be shifted to a lower frequency side, and the communication distance can be maintained and improved, without increasing the overall size of the antenna patterns 35D.

Sixth Example of Antenna Pattern

Figure 17A:
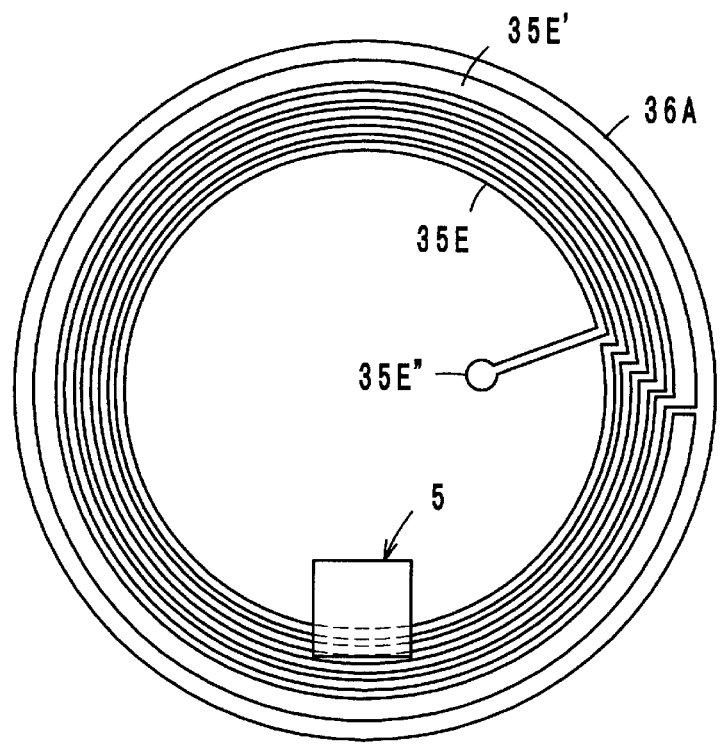
FIGS. 17A and 17B are front views showing a sixth example of an antenna pattern according to a preferred embodiment of the present invention.
Figure 17B:
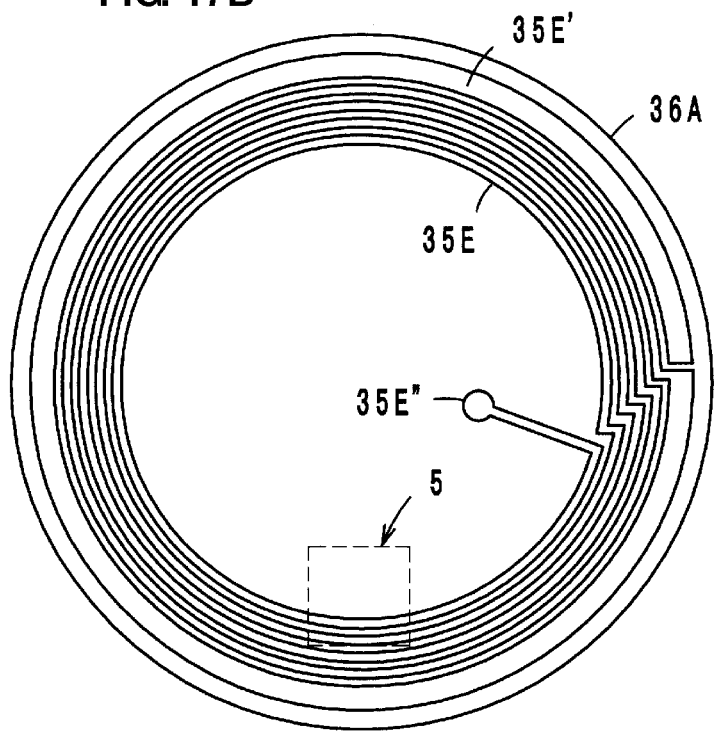
Figure 18:
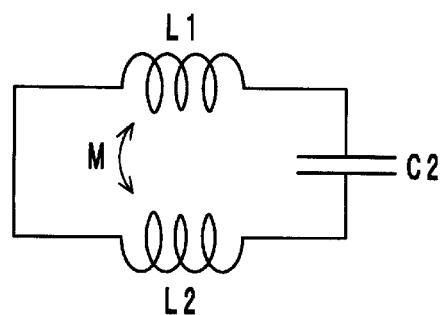
FIG. 18 is an equivalent circuit diagram of the antenna pattern according to the sixth example of a preferred embodiment of the present invention.

FIGS. 17A and 17B show antenna patterns 35E according to a sixth example of a preferred embodiment of the present invention. As in the antenna patterns 35D shown in FIGS. 16A and 16B, the antenna patterns 35E include outermost turn portions 35E' that have an increased width, and ends 35E" of the antenna patterns 35E arranged on the front and back surfaces of the base substrate 36A are DC-coupled to each other preferably using crimping, for example. The antenna patterns 35E define an equivalent circuit shown in FIG. 18. An inductor L1 defined by the antenna pattern 35E on the front surface side and an inductor L2 defined by the antenna pattern 35E on the back surface side are magnetically coupled M to each other. At the same time, the antenna patterns 35E at the ends 35E" are DC-coupled to each other, and the outermost turn portions 35E' are coupled to each other by the capacitance C2.

Figure 12A:
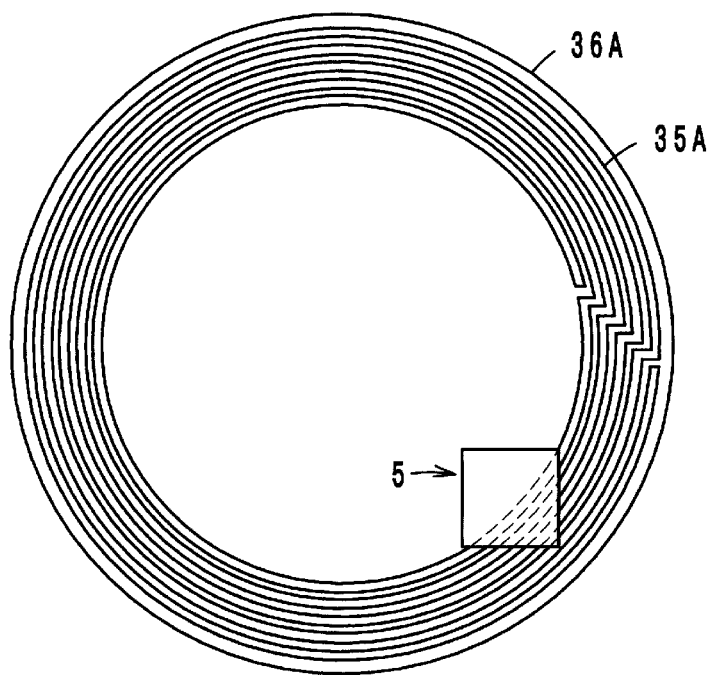
FIGS. 12A and 12B show antenna patterns of wireless communication device shown in FIG. 11.
Figure 12B:
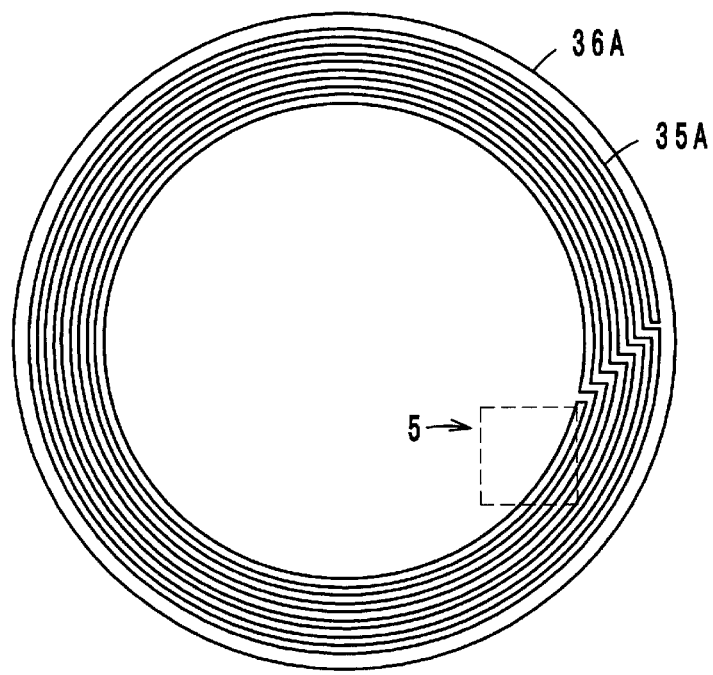

The operation of the antenna patterns 35E that are magnetically coupled to each other is the same or substantially the same as that described with respect to the antenna patterns 35A shown in FIGS. 12A and 12B. In particular, as in the antenna patterns 35D, with regard to the antenna patterns 35E, because the coupling capacitance value is increased in the outermost turn portions 35E', the resonant frequency of the antenna patterns 35E can be decreased. In other words, with regard to the antenna patterns 35E, a magnetic flux passing region can be enlarged without reducing the aperture size. Thus, the resonant frequency can be shifted to a lower frequency side, and the communication distance can be maintained and improved, without increasing the overall size of the antenna patterns 35E.

A wireless communication module and a wireless communication device according to the present invention are not limited to the above-described preferred embodiments, and various changes may be made to the preferred embodiments without departing from the scope of the present invention.

For example, in the above-described preferred embodiments, the loop-shaped electrode includes winding coil patterns that are wound a plurality of turns at a desired width. However, the loop-shaped electrode may include one turn at a desired width. Alternatively, the loop-shaped electrode may include coil patterns that are wound on a single layer, instead on a plurality of layers.

Also, the wireless IC chip and the loop-shaped electrode may not necessarily be DC-connected (directly connected) to each other, and may be coupled to each other via an electromagnetic field. That is, it is only necessary for the wireless IC chip and the loop-shaped electrode to be electrically connected to each other.

Also, the antenna patterns may have various shapes as long as they function as an antenna. The arrangement of the power feeding circuit substrate with respect to the antenna patterns may include various arrangements other than those shown in FIGS. 3A-3C and 9A-9C. Further, the above technology is not restricted to an HF band, such as the 13.56-MHz band, for example, and may be used in wireless communication devices at an UHF band or an SHF band. The wireless communication device may be configured as a card-shaped device or may be configured as a communication terminal, such as a cellular phone, for example.

As has been described above, preferred embodiments of the present invention are useful in a wireless communication module and a wireless communication device and are particularly useful in that, even when attached to a flexible base film, the possibility of detaching is low, and reduction of height can be achieved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A wireless communication module comprising:
    a flexible multilayer substrate including a plurality of stacked flexible base materials and a cavity provided therein;
    a wireless IC chip disposed in the cavity;
    a sealant filled in the cavity so as to cover the wireless IC chip, the sealant being harder than the flexible base materials; and
    a loop-shaped electrode including a coil pattern provided on or in the flexible multilayer substrate, the loop-shaped electrode being coupled to the wireless IC chip; wherein
    the coil pattern is provided outside the cavity when viewed in plan;
    the coil pattern is made of a conductive material that is harder than the flexible base materials;
    the coil pattern is wound a plurality of turns around a lateral portion of the sealant filled in the cavity; and
    a density of the coil pattern increases continuously or step-wise from an outer circumference to an inner circumference in all radial directions of the coil pattern.

2. The wireless communication module according to claim 1, wherein the flexible base materials are made of a thermoplastic resin, and the sealant is made of a thermosetting resin.

3. The wireless communication module according to claim 1, wherein a depth of the cavity is greater than or equal to about half a thickness of the flexible multilayer substrate.

4. The wireless communication module according to claim 1, wherein the coil pattern includes a plurality of layers provided in the flexible multilayer substrate, and at least portions of coil patterns provided on adjacent ones of the plurality of layers do not overlap each other when viewed in plan from a coil axis direction of the coil pattern.

5. The wireless communication module according to claim 1, wherein the sealant includes a magnetic filler.

6. A wireless communication device comprising:
    a wireless communication module; and
    a flexible base substrate on which the wireless communication module is mounted; wherein
    the wireless communication module includes:
        a flexible multilayer substrate including a plurality of stacked flexible base materials and a cavity provided therein;
        a wireless IC chip disposed in the cavity;
        a sealant filled in the cavity so as to cover the wireless IC chip, the sealant being harder than the flexible base materials; and
        a loop-shaped electrode including a coil pattern provided on or in the flexible multilayer substrate, the loop-shaped electrode being coupled to the wireless IC chip;
    the coil pattern is provided outside the cavity when viewed in plan;
    the coil pattern is made of a conductive material that is harder than the flexible base materials;

the coil pattern is wound a plurality of turns around a lateral portion of the sealant filled in the cavity; and a density of the coil pattern increases continuously or step-wise from an outer circumference to an inner circumference in all radial directions of the coil pattern.

7. The wireless communication device according to claim 6, wherein an antenna pattern is provided on the base substrate, and the antenna pattern is magnetically coupled to the loop-shaped electrode.

8. The wireless communication device according to claim 7, wherein the wireless communication module is arranged on the base substrate so that, when viewed in plan, the wireless communication module includes a first region in which the coil pattern overlaps the antenna pattern and a second region in which the coil pattern does not overlap the antenna pattern.

9. The wireless communication device according to claim 6, wherein the wireless communication module is mounted on the base substrate in a state in which an opening portion of the cavity faces the base substrate.

10. The wireless communication system according to claim 6, wherein the flexible base materials are made of a thermoplastic resin, and the sealant is made of a thermosetting resin.

11. The wireless communication system according to claim 6, wherein a depth of the cavity is greater than or equal to about half a thickness of the flexible multilayer substrate.

12. The wireless communication system according to claim 6, wherein the coil pattern includes a plurality of layers provided in the flexible multilayer substrate, and at least portions of coil patterns provided on adjacent ones of the plurality of layers do not overlap each other when viewed in plan from a coil axis direction of the coil pattern.

13. The wireless communication system according to claim 6, wherein the sealant includes a magnetic filler.

* * * * *

UNITED STATES PATENT AND TRADEMARK OFFICE
CERTIFICATE OF CORRECTION

PATENT NO. : 10,013,650 B2
APPLICATION NO. : 13/598872
DATED : July 3, 2018
INVENTOR(S) : Murayama et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 997 days.

Signed and Sealed this
Twenty-third Day of April, 2019

Andrei Iancu
*Director of the United States Patent and Trademark Office*